United States Patent
Spreitzer et al.

(10) Patent No.: US 7,041,388 B1
(45) Date of Patent: May 9, 2006

(54) SUBSTITUTED POLY(ARYLENE VINYLENES), PROCESS FOR THEIR PREPARATION AND THEIR USE IN ELECTROLUMINESCENT DEVICES

(75) Inventors: Hubert Spreitzer, Viernheim (DE); Heinrich Becker, Glashütten (DE); Philipp Stössel, Frankfurt (DE)

(73) Assignee: Semiconductors GmbH, (DE)

( * ) Notice: Subject to any disclaimer, the term of this patent is extended or adjusted under 35 U.S.C. 154(b) by 0 days.

(21) Appl. No.: 10/130,487

(22) PCT Filed: Oct. 28, 2000

(86) PCT No.: PCT/EP00/10645

§ 371 (c)(1),
(2), (4) Date: May 24, 2002

(87) PCT Pub. No.: WO01/34722

PCT Pub. Date: May 17, 2001

(30) Foreign Application Priority Data

Nov. 9, 1999 (DE) ................................ 199 53 806

(51) Int. Cl.
*H05B 33/14* (2006.01)
*C09K 11/06* (2006.01)
*C08G 61/00* (2006.01)

(52) U.S. Cl. ............... 428/690; 428/917; 313/504; 313/506; 257/40; 257/E51.031; 526/294; 528/86; 528/380; 528/397; 528/403; 528/417; 528/423

(58) Field of Classification Search ........... 428/690, 428/917; 313/504, 506; 257/40, E51.031; 252/301.35; 526/294; 528/397, 425
See application file for complete search history.

(56) References Cited

U.S. PATENT DOCUMENTS

| | | | |
|---|---|---|---|
| 3,172,862 A | 3/1965 | Gurnee et al. | 252/301.3 |
| 4,539,507 A | 9/1985 | VanSlyke et al. | 313/504 |
| 5,151,629 A | 9/1992 | VanSlyke | 313/504 |
| 5,358,788 A * | 10/1994 | Kawamura et al. | 428/446 |
| 5,558,904 A | 9/1996 | Hsieh et al. | 427/66 |
| 5,817,430 A | 10/1998 | Hsieh | 428/690 |
| 2003/0065190 A1 * | 4/2003 | Spreitzer et al. | 548/134 |

FOREIGN PATENT DOCUMENTS

| | | |
|---|---|---|
| EP | 0 423 283 | 1/1995 |
| EP | 0 443 861 | 7/1995 |
| JP | 1-197175 | 8/1989 |
| WO | WO 90/13148 | 11/1990 |
| WO | 98/27136 | 6/1998 |
| WO | 99/21936 | 5/1999 |
| WO | 99/24526 | 5/1999 |

OTHER PUBLICATIONS

Chen et al., "Photoluminescent Poly(p-phenylenevinylene)s with an Aromatic Oxadiazole Moiety . . . ", Macromolecules, 32, pp. 4351-4358, (Published on Web Jun. 10, 1999).*

Okada Hisashi, "Organic Electroluminescence Element Material and Organic Electroluminescence Element Using the Same," Patent Abs. of Japan 1999 : No. 09, Abstract of JP 11 097175 (Fuji Film Co Ltd), (Apr. 9, 1999).

* cited by examiner

*Primary Examiner*—Marie Yamnitzky
(74) *Attorney, Agent, or Firm*—Connolly Dove Lodge & Hutz

(57) ABSTRACT

The present invention describes poly(arylenevinylenes) comprising poly(arylphenylenevinylene) units whose phenylene unit bears a further aryl substituent in the para or meta position relative to the first aryl radical (formula (I)), as a result of which the operating life in EL elements can be increased and high EL efficiencies can be maintained.

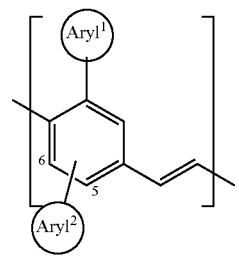

(I)

17 Claims, 6 Drawing Sheets

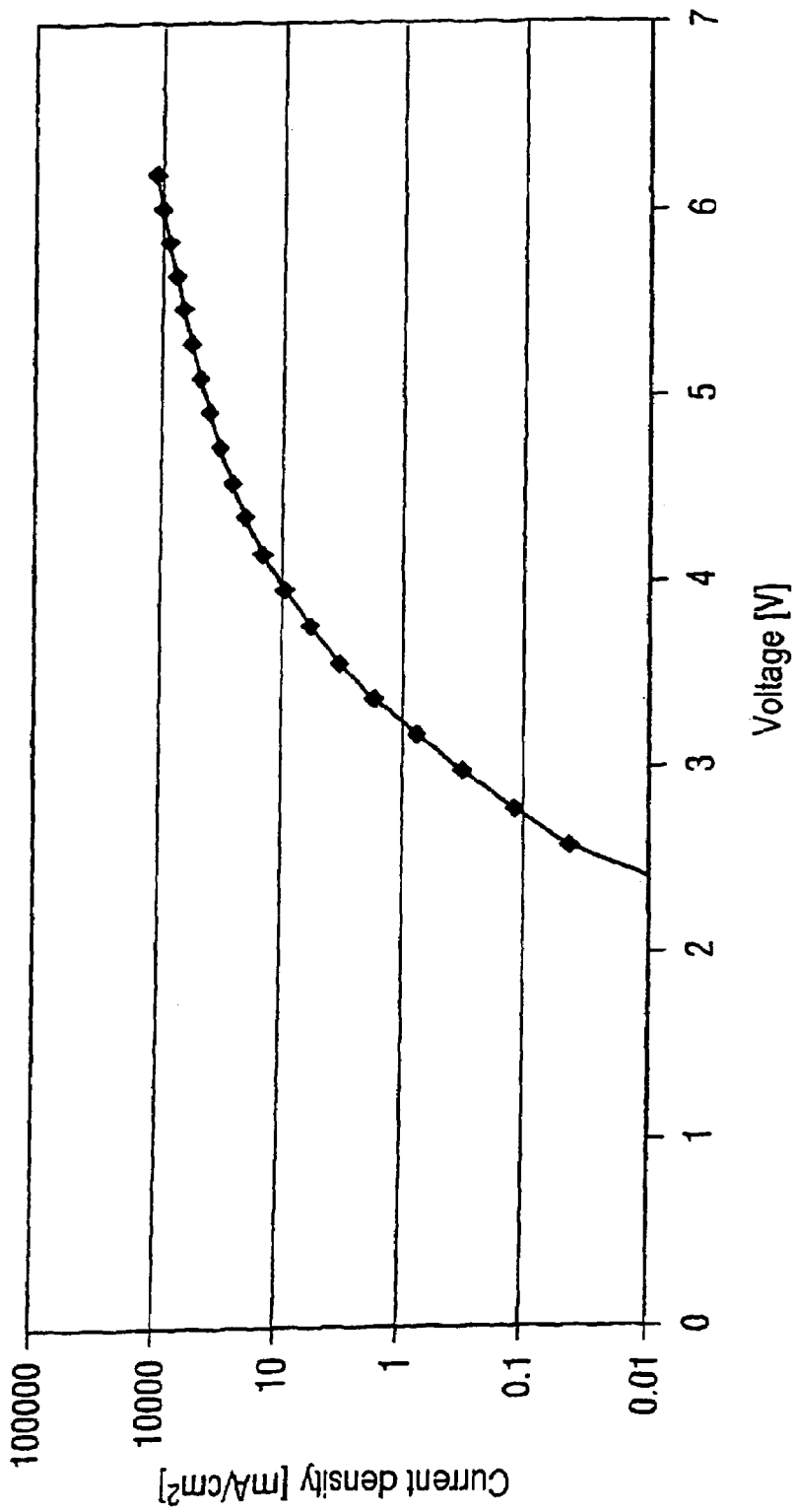
*Fig. 3a* CURRENT DENSITY [mA/cm²]/VOLTAGE [V] CHARACTERISTICS OF POLYMER P1

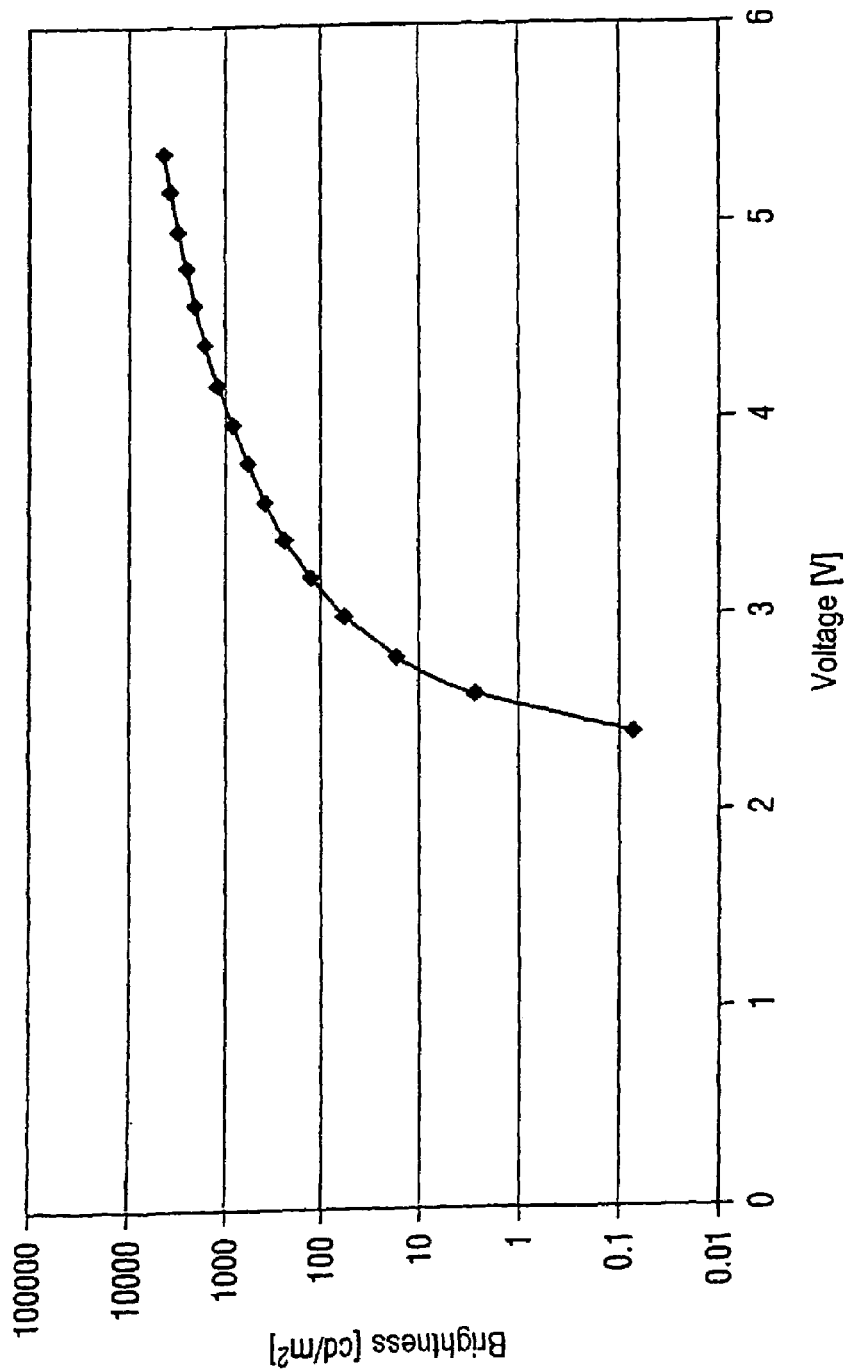
Fig. 3c  BRIGHTNESS [cd/m²] /VOLTAGE [V] CHARACTERISTICS OF POLYMER P1

SUBSTITUTED POLY(ARYLENE VINYLENES), PROCESS FOR THEIR PREPARATION AND THEIR USE IN ELECTROLUMINESCENT DEVICES

There is considerable demand in industry for large-area solid-state light sources for a number of applications, predominantly in the area of display elements, display screen technology and illumination technology. The demands made of these light sources can currently not be met entirely satisfactorily by any of the existing technologies.

As an alternative to conventional display and illumination elements, for example incandescent lamps, gas discharge lamps and non-self-illuminating liquid crystal display elements, electroluminescent (EL) materials and devices such as light-emitting diodes (LEDs) have already been in use for some time.

Apart from inorganic electroluminescent materials and devices, low molecular weight, organic electroluminescent materials and devices have been known for about 30 years (cf., for example, U.S. Pat. No. 3,172,862). Until recently, however, the practical utility of such devices was greatly restricted.

EP 423 283 and EP 443 861 describe electroluminescent devices which comprise a film of a conjugated polymer as light-emitting layer (semiconductor layer). Such devices have numerous advantages, for example the possibility of producing large-area, flexible displays in a simple and inexpensive manner. In contrast to liquid crystal displays, electroluminescent displays are self-illuminating and therefore do not require an additional back-lighting source.

A typical device in accordance with EP 423 283 comprises a light-emitting layer in the form of a thin, dense polymer film (semiconductor layer) which comprises at least one conjugated polymer. A first contact layer is in contact with a first surface, and a second contact layer is in contact with a further surface of the semiconductor layer. The polymer film of the semiconductor layer has a sufficiently low concentration of extrinsic charge carriers, so that, on application of an electric field between the two contact layers, charge carriers are introduced into the semiconductor layer, resulting in one contact layer becoming positive compared to the other and the semiconductor layer emitting radiation. The polymers used in such devices are referred to as conjugated. For the purposes of the present invention, a conjugated polymer is a polymer which has a delocalized electron system along the main chain. The delocalized electron system gives the polymer semiconductor properties and enables it to transport positive and/or negative charge carriers with high mobility.

EP 423 283 and EP 443 861 describe poly(p-phenylenevinylene) as polymeric material for the light-emitting layer. This polymer may be modified on the aromatic ring by alkyl, alkoxy, halogen or nitro substituents in order to improve the properties. Polymers of this type have since then been investigated in a large number of studies, and bisalkoxy-substituted PPVs in particular have been optimized a very long way toward applicational maturity (cf., for example, B. J. Salbeck, Ber. Bunsenges. Phys. Chem. 1996, 100, 1667).

The patent application WO98/27136 describes aryl-substituted poly(p-arylenevinylenes) which are suitable, inter alia, for generating green electroluminescence. A further improvement in the polymers published there is disclosed in WO99/24526. In that publication, a defect in such polymers is also disclosed: depending on the polymer, various proportions of triple and single bonds (TBB defect) occur in the main chain. The proportion of this defect is obviously related inversely to the achievable life: a high proportion of defects reduces the operating life, while a low proportion increases it significantly. The above mentioned application WO99/24526 discloses that the frequency of defects can be influenced by the substitution pattern employed and that this frequency can be significantly reduced in polymers of aryl-substituted monomers (as in WO98/27136) by insertion of CN, F, Cl, an amino group, an alkyl group or a (thio)alkoxy group.

It has now surprisingly been found that poly(arylenevinylenes) comprising poly(arylphenylenevinylene) units whose phenylene unit bears a further aryl substituent in the para or meta position relative to the first aryl radical (formula (I)) display the effect described in the abovementioned patent application to an unexpectedly pronounced extent. The operating life of EL elements can be increased further in this way. This is naturally of great relevance in use and of economic importance. The high EL efficiencies are retained.

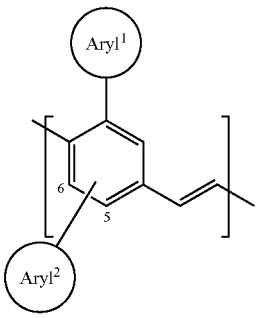

(I)

U.S. Pat. No. 5,558,904, discloses, in particular in columns 5, 10, 13 and 23, polymers having a structure analogous to formula (I) in which the two substituents $Aryl^1$ and $Aryl^2$ are either unsubstituted or substituted only by short-chain substituents (fluorine, cyano, methoxy, phenyl). However, homopolymers or copolymers having a proportion of such structures of greater than about 25 mol % are, as can be seen from the following comparative experiment, insoluble.

For the purposes of the present invention, solubility and insolubility are defined in the same way as in WO99/21936 (page 3, lines 2 to 7): soluble polymers are ones which in a concentration range of at least 0.5% in a customary organic solvent (aromatic and nonaromatic solvents which may contain halogen or be halogen-free, e.g. toluene, anisole, chlorobenzene, methylene chloride, chloroform, xylene, dioxane, THF, cyclohexanone and the like) form a clear, ungelled solution at room temperature or at least at a temperature below 60° C., preferably below 50° C., particularly preferably below 40° C. This property is necessary for the polymer to be processed industrially to give thin films. On the other hand, for the purposes of this definition, insoluble means that the polymers give a clear solution only at significantly low concentrations or gel at just above about 60° C.

The polymers of the present invention display such solubility, but the polymers disclosed in U.S. Pat. No. 5,558,904 do not, so that the two are not identical. The polymers of the present invention represent a significant improvement compared to this prior art.

U.S. Pat. No. 5,817,430 discloses a monomer having a structure which is encompassed by the formula (I) (column 9). That patent is concerned with the solubility of polymers prepared from such monomers. However, in contrast to the present invention, the solubility is achieved not by appropriate substitution or copolymerization but by a reduction in the molecular weight. However, this measure is detrimental to the objective of a long operating life in an electroluminescent element. The polymers disclosed there differ in this respect from those of the present invention.

Japanese application JP 11/97175 discloses various structures (cf. structures 1 to 10, 13, 16 to 19, 21 to 26) of the type encompassed by the formula (I). However, the deficiency indicated above is once again present: if these structures are used as homopolymer or in a proportion of more than about 25%, the resulting polymers are insoluble for the purposes of the present patent application.

WO99/21936 discloses structures of the type encompassed by the formula (I) by way of the generic formula (page 4, page 22; C2) and the examples of monomers (page 15). Although WO99/21936 discloses soluble polymers (page 3), it is not known how these soluble polymers, especially those having the terphenyl structures disclosed, are to be obtained. This is especially unclear when these structures are present in proportions of more than 25%, as is preferred in WO99/21936 (page 2, lines 6 to 12 in conjunction with the data in table 2, page 20).

Use of the explicitly mentioned monomer 4,4''-bis(3,7-dimethyloctyloxy)-2',5'-bis(chloromethyl)-p-terphenyl, e.g. in a ratio of 30 mol % as comonomer together with 2,5-bis(chloromethyl)-3'-(3,7-dimethyloctyloxy)biphenyl (cf. comparative examples), gives polymers which are insoluble according to the definition of the present patent application. In general, insolubility has to be expected at a proportion of more than 20% of 2,5-bis(4-substituted phenyl)phenylenevinylene structural elements. This is independent of the substituent chosen (e.g. substituents $R^1$, R' or R'' of the present patent application) and can be explained in terms of the high structural order of the polyarylenevinylenes obtained in this way. Accordingly, the polymers known from WO99/21936 are different from the subject matter of the present invention.

The materials described in the prior art display, firstly, no particular effects in these structural elements and, secondly, no desirable properties as are required for industrial use. In particular, the prior art attempts to control the problem of solubility by means of a variety of measures, but control by means of appropriate substitution or copolymerization of such complex polymeric materials is not reported.

FIG. 1b is an expanded view of a portion of FIG. 1a.

FIGS. 3a–3c show characteristics of a polymer LED made with polymer P1.

Figure 1A:
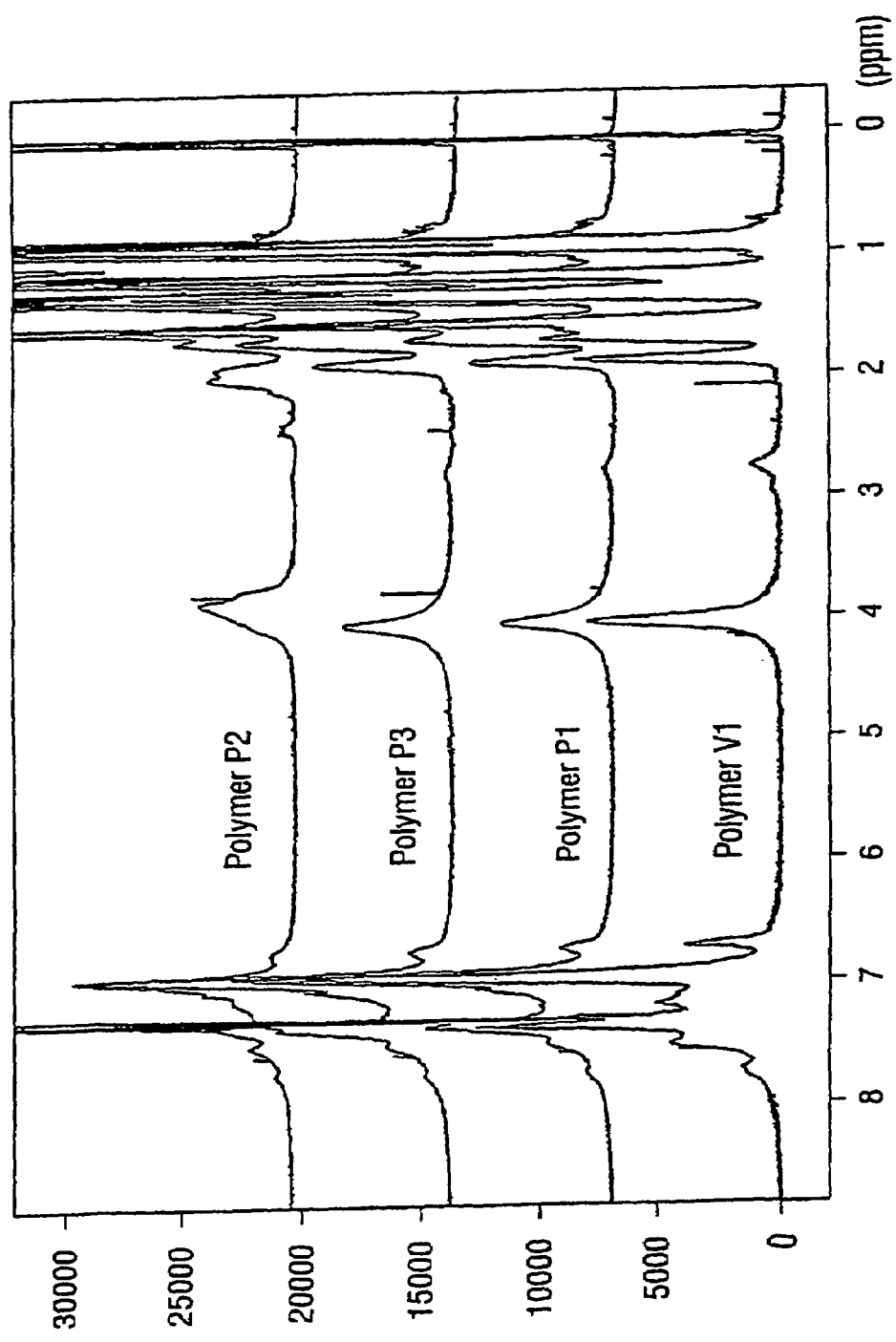
FIGS. 1a–1b show $^1$H-NMR spectra of polymers V1, P1, P2 and P3.

The invention accordingly provides poly(arylenevinylenes) comprising at least 25 mol % of one or more repeating units of the formula (1),

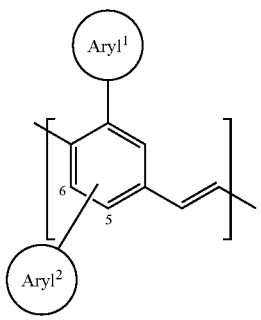

(I)

where the symbols and indices have the following meanings:

Aryl$^1$, Aryl$^2$ are 2-(1,3,4-oxadiazol)yl, or aryl or heteroaryl groups which have from 4 to 14 carbon atoms and may in each case be substituted by from 1 to 5 substituents of the type R';

R' is, identical or different at each occurrence, CN, F, Cl or a straight-chain, branched or cyclic alkyl or alkoxy group having from 1 to 20 carbon atoms, where one or more nonadjacent $CH_2$ groups may be replaced by —O—, —S—, —CO—, —COO—, —O—CO—, —NR$^1$—, —(NR$^2$R$^3$)+—A$^-$ or —CONR$^4$— and one or more H atoms can be replaced by F, or an aryl or heteroaryl group which has from 4 to 14 carbon atoms and may be replaced by one or more nonaromatic radicals R';

$R^1$,$R^2$,$R^3$, $R^4$ are identical or different and are each H or an aliphatic or aromatic hydrocarbon radical having from 1 to 20 carbon atoms;

A$^-$ is a singly charged anion or its equivalent; characterized in that the polymer is soluble according to the definition of the present patent application;

with the proviso that the two aryl groups Aryl$^1$ and Aryl$^2$ are substituted by R' substituents in such a way that the total number of nonaromatic carbon atoms present in the identical or different substituents R' is at least 4, preferably at least 8, very particularly preferably at least 12, and at the same time either the total proportion of repeating units (I) does not exceed 50 mol % or at least 5 mol % of a selected, bulky repeating unit of the type (II) or (III)

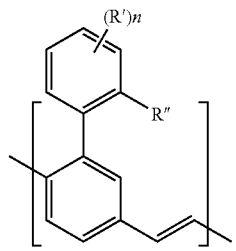

(II)

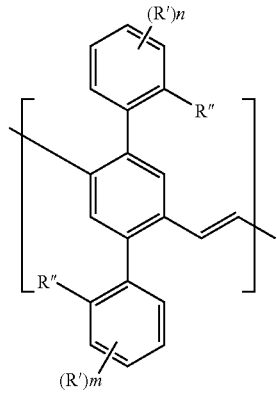

(III)

which significantly increases the solubility are present, where

R'' are identical or different and are each a straight-chain, branched or cyclic $C_1$–$C_6$-alkyl or alkoxy group, where one or more nonadjacent $CH_2$ groups may be replaced by —O—, —S—, —CO—, —COO—, —O—CO—, —NR$^1$—, —(NR$^2$R$^3$)+—A$^-$ or —CONR$^4$— and one or more H atoms may be replaced by F or an aryl or heteroaryl group which has from 4 to 12 carbon atoms and may be substituted by one or more nonaromatic radicals R'';

n, m are identical or different and are each 0, 1, 2, 3, 4, preferably 0, 1, 2; and the other radicals are as defined above, with the proviso that when the repeating unit of the formula (I) also contains 2,5-bis(4-substituted phenyl)phenylenevinylene structural elements, their total does not exceed 20 mol %.

It is preferred that each R" is independently phenyl or $C_1$–$C_6$alkyl, particularly preferably methyl.

The polymers of the invention are very suitable for use as electroluminescent materials. They have, for example, the advantage that they display a constant brightness in long-term operation, even at elevated temperatures (e.g. heating at 85° C. for a number of hours).

It is therefore not necessary to adjust the voltage during long-term operation in order to maintain the initial brightness. This advantage is particularly useful in battery operation, since the maximum economically possible voltage is greatly restricted here.

Likewise, devices comprising the polymers of the invention have a long life and a high EL efficiency.

The polymers generally have from 10 to 10 000, preferably from 20 to 5 000, particularly preferably from 100 to 5 000, very particularly preferably from 250 to 2 000, repeating units.

Polymers according to the invention contain at least 25% of repeating units of the formula (I), preferably at least 30%.

Preference is also given to copolymers comprising repeating units of the formula (I) and repeating units having unsubstituted and/or substituted poly(arylenevinylene) structures, preferably ones having a 2,5-dialkoxy-1,4-phenylenevinylene structure and/or a 2-aryl-1,4-arylenevinylene structure.

Also preferred are copolymers containing 1, 2 or 3 different repeating units of the formula (I).

For the purposes of the invention, copolymers encompass random, alternating, regular and block-like structures.

Preference is likewise given to polymers comprising repeating units of the formula (I) in which the symbols and indices have the following meanings:
$Aryl^1$, $Aryl^2$ are identical or different and are each phenyl, 1- or 2-naphthyl, 1-, 2- or 9-anthracenyl, 2-, 3- or 4-pyridinyl, 2-, 4- or 5-pyrimidinyl, 2-pyrazinyl, 3- or 4-pyridazinyl, 2-, 3-, 4-, 5-, 6-, 7- or 8-quinoline, 2- or 3-thiophenyl, 2- or 3-pyrrolyl, 2- or 3-furanyl and 2-(1,3,4-oxadiazol)yl.

Particular preference is given to polymers in which the aryl substituents $Aryl^1$, $Aryl^2$ in the formula (I) have the following meanings: phenyl, 1-naphthyl, 2-naphthyl or 9-anthracenyl.

Particular preference is also given to polymers in which the aryl substituents $Aryl^1$, $Aryl^2$ in the formula (I) have the following substitution pattern:
2-, 3- or 4-alkyl(oxy)phenyl, 2,3-, 2,4-, 2,5-, 2,6-, 3,4- or 3,5-dialkyl(oxy)phenyl, 2,3,4,-, 2,3,5-, 2,3,6-, 2,4,5-, 2,4, 6- or 3,4,5-trialkyl(oxy)phenyl, 2-, 3-, 4-, 5-, 6-, 7- or 8-alkyl(oxy)-1-naphthyl, 1-, 3-, 4-, 5-, 6-, 7- or 8-alkyl (oxy)-2-naphthyl and 10-alkyl(oxy)-9-anthracenyl.

It is possible for the two aryl substituents $Aryl^1$ and $Aryl^2$ on one repeating unit of the formula (I) to be identical to or different from one another. Different in this context can mean simply a different substitution pattern. This can represent a preferred embodiment of the invention in order to increase the solubility.

The polymers of the invention can, for example, be obtained from starting materials of the formula (IV), in which the symbols and indices have the meanings indicated under formula (I) and Hal, Hal' are each Cl, Br or I, by dehydrohalogenation polymerization; this is generally achieved by reacting one or more monomers with a suitable base in a suitable solvent.

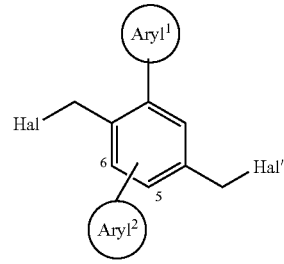

(IV)

A description of customary polymerization variants is given in WO99/24526 and WO98/27136. The text of those applications is hereby expressly incorporated by reference into the present patent application.

Symmetrical terphenyl derivatives of the formula (IV) can, for example, be obtained by the route outlined in scheme 1:

Scheme 1:

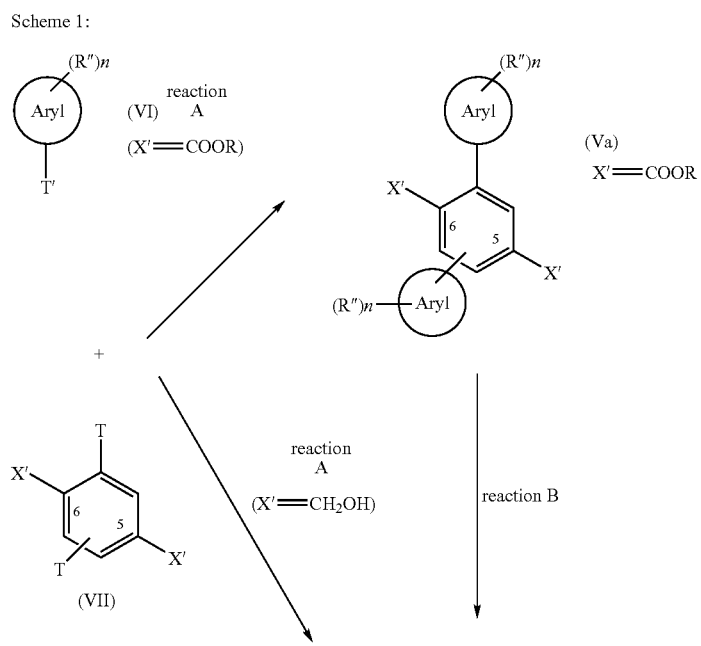

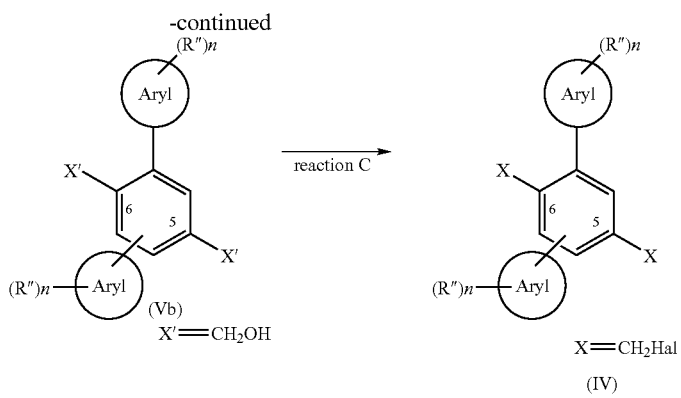

Unsymmetrical terphenyl derivatives of the formula (IV) can be obtained by the route outlined in scheme 2:

Scheme 2:

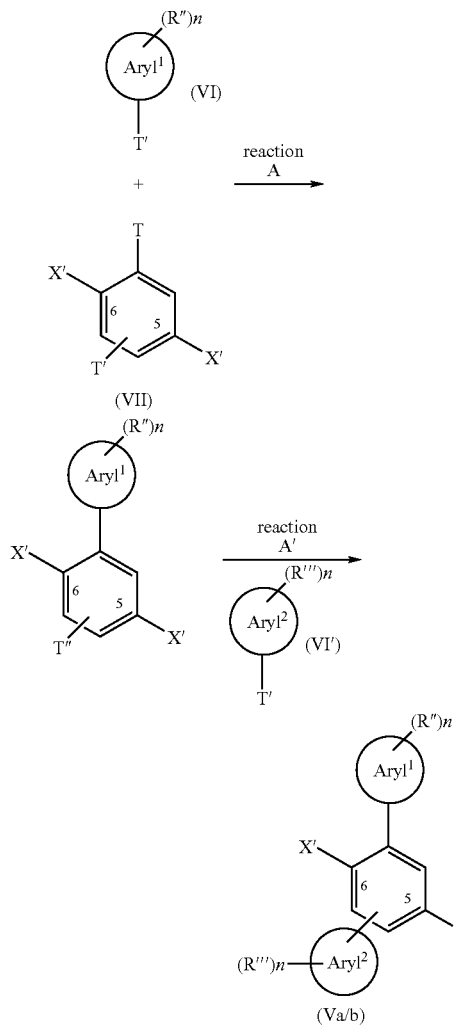

The intermediates (Va/b) obtained in accordance with scheme 2 can then be converted in a manner analogous to scheme 1 by means of reactions B and C into the desired monomers.

The starting compounds of the formulae (VI) and (VII) are readily available, since they can be prepared in a simple manner and in large quantities from commercially available compounds. Details may be found in the published description of WO99/24526.

The methods of carrying out the reactions A (A'), B and C and preferred embodiments thereof are likewise described in the abovementioned patent publications (WO98/27136, WO99/24526) and are hereby expressly incorporated by reference into the present patent application.

In the synthesis of unsymmetrical terphenyl derivatives in accordance with scheme 2, the method has to be modified somewhat in respect of reaction A in that a compound (VII) having different functions T (e.g. Br) and T" (e.g. Cl) is used and is reacted in succession under varying conditions with two different compounds of the type (VI). This can be done, for example, by means of two Suzuki reactions: here, only the more reactive leaving group (bromine) is firstly replaced under "normal conditions" (reaction A) (cf., for example, examples C1 to C10 in WO99/24526) and, in a second reaction under altered conditions (optimization of chlorine Suzuki reactions cf.: J. P. Wolfe, S. L. Buchwald, *Angew. Chem.* 1999, 111, 2570 and references), the significantly less reactive chlorine group is then replaced. In this way, it is readily possible to synthesize terphenyls having a different substitution pattern or different aryl rings.

The synthetic methods described here or incorporated by reference make it possible to prepare, for example, the following monomers which can be reacted to produce polymers according to the invention.

Monomer 1

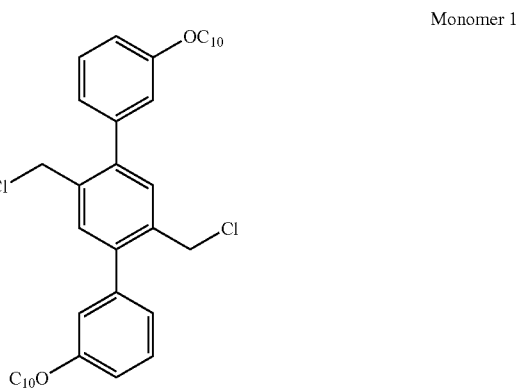

-continued
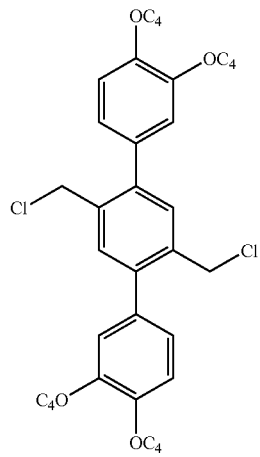
Monomer 2
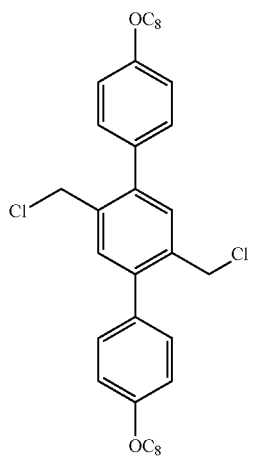
Monomer 5
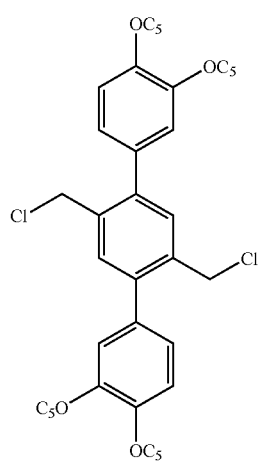
Monomer 3
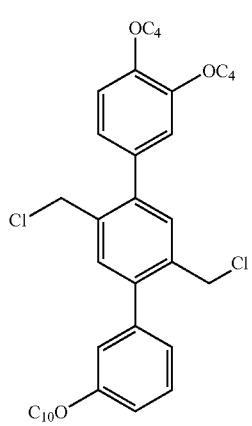
Monomer 6
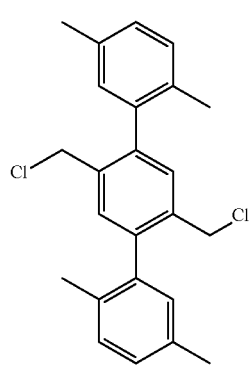
Monomer 4
Monomer 7

-continued
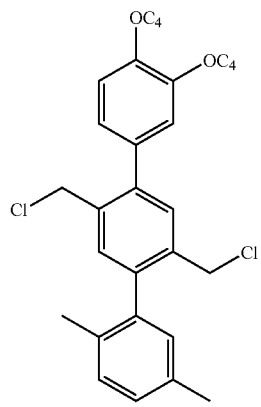
Monomer 8
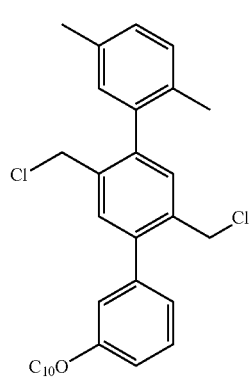
Monomer 9
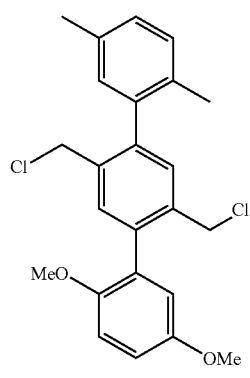
Monomer 10
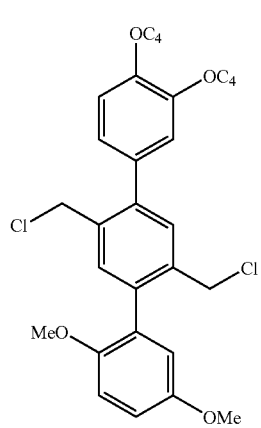
Monomer 11
-continued
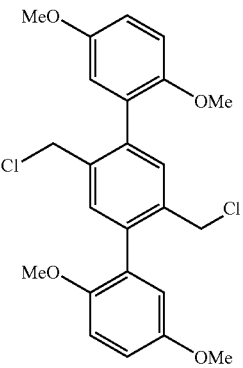
Monomer 12
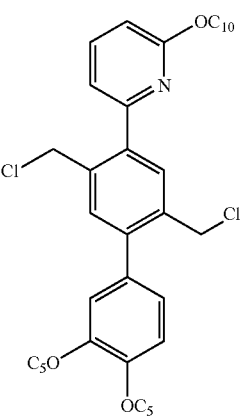
Monomer 13
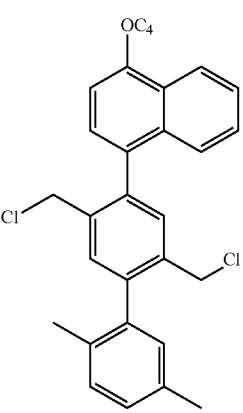
Monomer 14
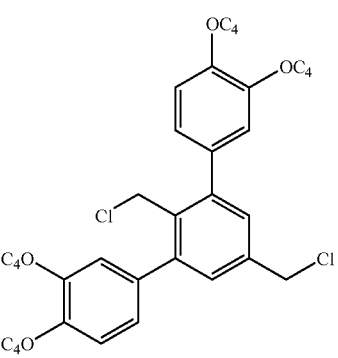
Monomer 15

Monomer 16
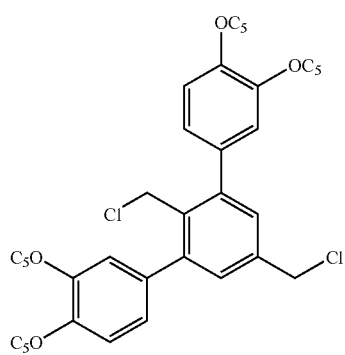
Monomer 20
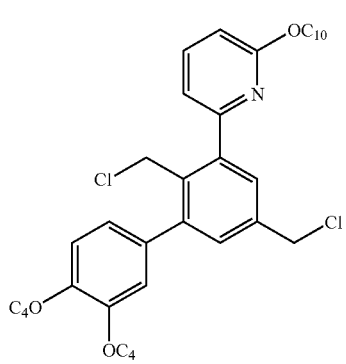
Monomer 17
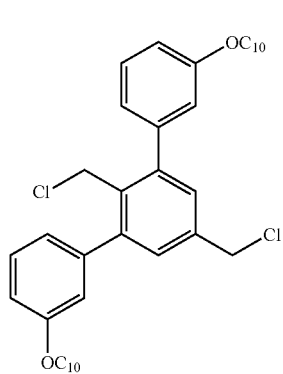
Monomer 21
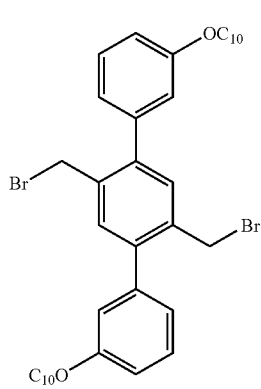
Monomer 18
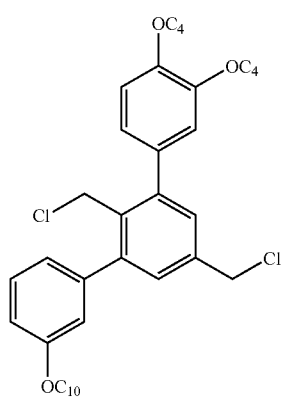
Monomer 22
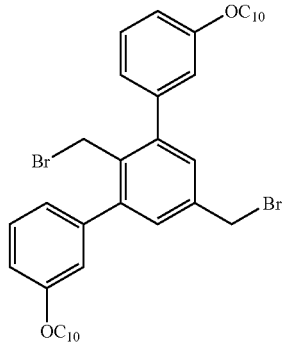
Monomer 19
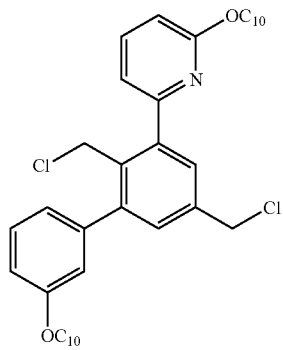
Monomer 23
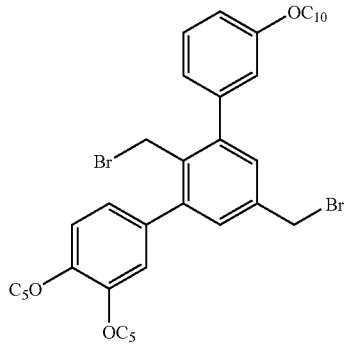

Monomer 24

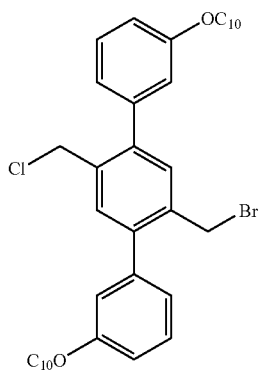

Monomer 25

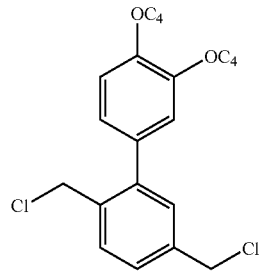

Such monomers of the formula (II) can then be converted by the above-described polymerization routes, with addition of further comonomers, into polymers comprising repeating units of the formula (I). Comonomers suitable for this purpose are, for example, the compounds shown below.

Monomer A

Monomer B

Monomer C

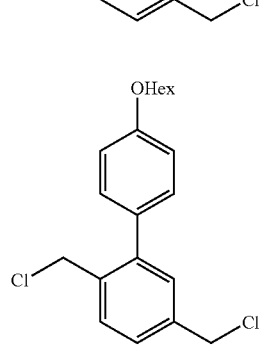

Monomer D

Monomer E

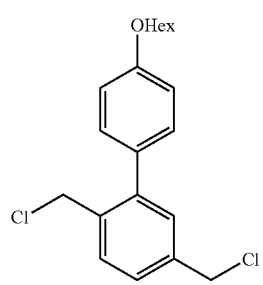

Monomer F

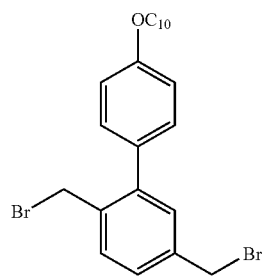

Monomer G

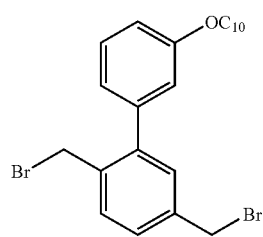

Monomer H

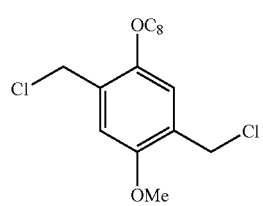

-continued
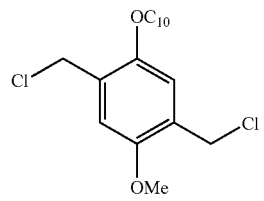
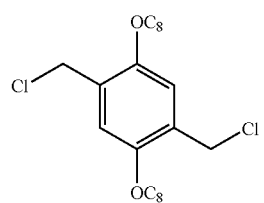
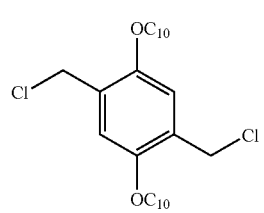
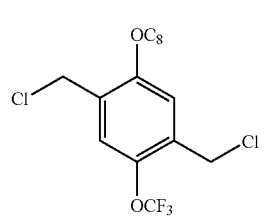
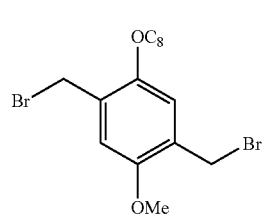
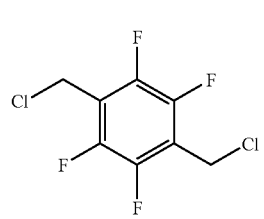
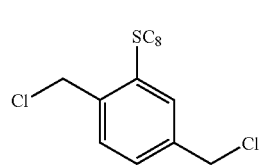
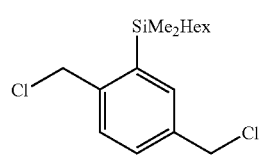
-continued
Monomer I
Monomer J
Monomer K
Monomer L
Monomer M
Monomer N
Monomer O
Monomer P
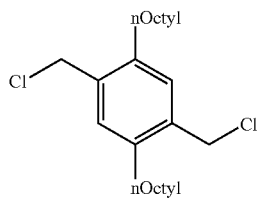
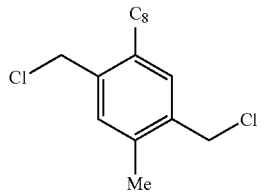
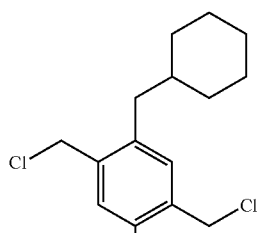
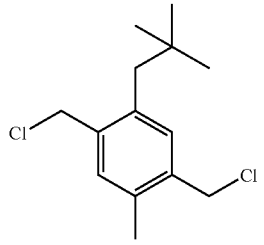
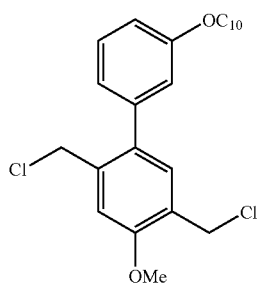
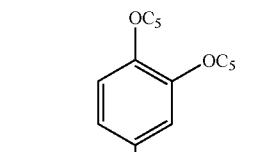
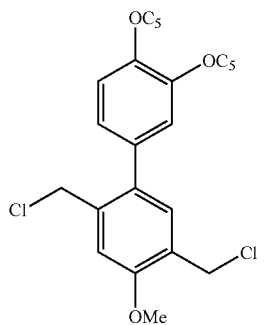
Monomer Q
Monomer R
Monomer S
Monomer T
Monomer U
Monomer V -continued

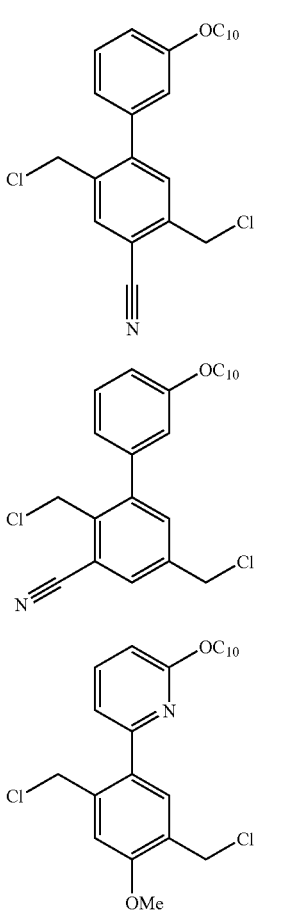

Monomer W

Monomer X

Monomer Y

Abbreviations: $C_4$: 2-methylpropyl; $C_8$: 2-ethylhexyl; $C_{10}$: 3,7-dimethyloctyl.

The novel polymers produced in this way are particularly useful as electroluminescent materials.

For the purposes of the present invention, electroluminescent materials are materials which can be used as active layer in an electroluminescent device. Active layer means that the layer is capable of radiating light on application of an electric field (light-emitting layer) and/or it improves the injection and/or transport of the positive and/or negative charges (charge injection layer or charge transport layer).

The invention therefore also provides for the use of a polymer according to the invention in an electroluminescent device, in particular as electroluminescent material.

To be able to be used as electroluminescent materials, the polymers comprising structural units of the formula (I) are applied in the form of a film to a substrate, generally by known methods with which those skilled in the art are familiar, e.g. dipping or spin coating or various printing methods (e.g. ink jet printing, offset printing).

Accordingly, the invention likewise provides an electroluminescent device comprising one or more active layers of which at least one comprises one or more polymers according to the invention. The active layer can be, for example, a light-emitting layer and/or a transport layer and/or a charge injection layer.

The general structure of such electroluminescent devices is described, for example, in U.S. Pat. No. 4,539,507 and U.S. Pat. No. 5,151,629. Polymer-containing electroluminescent devices are described, for example, in WO-A 90/13148 or EP-A 0 443 861.

They usually comprise an electroluminescent layer between a cathode and an anode, with at least one of the electrodes being transparent. In addition, one or more electron injection layers and/or electron transport layers can be inserted between the electroluminescent layer and the cathode and/or one or more hole injection layers and/or hole transport layers can be inserted between the electroluminescent layer and the anode. As cathode, preference is given to using metals or metallic alloys, e.g. Ca, Mg, Al, In, Mg/Ag. As anode, it is possible to use metals, e.g. Au, or other metallically conductive materials such as oxides, e.g. ITO (indium oxide/tin oxide) on a transparent substrate, e.g. comprising glass or a transparent polymer.

In operation, the cathode is placed at a negative potential relative to the anode. As a result, electrons from the cathode are injected into the electron injection layer/electron transport layer or directly into the light-emitting layer. At the same time, holes from the anode are injected into the hole injection layer/hole transport layer or directly into the light-emitting layer.

Under the action of the applied voltage, the injected charge carriers move through the active layers toward one another. This leads to electron/hole pairs at the interface between charge transport layer and light-emitting layer or within the light-emitting layer and these then recombine with emission of light.

The color of the emitted light can be varied by varying the materials used as light-emitting layer.

Electroluminescent devices are used, for example, as self-illuminating display elements such as control lamps, alphanumeric displays, signs and in opto-electronic couplers.

The invention is illustrated by the following examples, without being restricted thereto.

Part 1: Synthesis of the Monomers

A. Synthesis of Compounds of the Formula (VII)

EXAMPLE A1

Synthesis of diethyl 2,5-dibromoterephthalate a) Synthesis of 2,5-dibromo-p-xylene Bromine (1 918 g, 12 mol) was added dropwise to an initially charged mixture of p-xylene (637 g, 6 mol) and Fe powder (10 g) in dichloromethane (1 300 ml) while stirring. Commencement of the reaction was evident from gas evolution. The remaining bromine was then added dropwise at room temperature over a period of 5 hours while cooling in a water bath. The reaction mixture was stirred overnight. The mixture was subsequently stirred with saturated aqueous $Na_2SO_3$ solution and HCl. The decolorized solution was shaken once with dilute aqueous NaOH and twice with $H_2O$, and the solvent was subsequently removed under reduced pressure. The crude product obtained was purified further by recrystallization from hexane (about 800 ml).

The product was obtained as a colorless crystalline powder: 1 281 g (81%).

Melting point: 71.8° C.

$^1$H-NMR ($CDCl_3$): [ppm]=7.38 (s, 2H, H-aryl), 2.32 (s, 6H, $CH_3$).

b) Synthesis of 2,5-dibromoterephthalic acid

A solution of cobalt acetate tetrahydrate (1.25 g, 5 mmol), manganese acetate tetrahydrate (1.23 g), HBr (0.81 g), sodium acetate (1.37 g) and 2,5-dibromo->xylene (132 g, 0.5 mol) in 500 g of glacial acetic acid was placed in a 1 l autoclave (HC-22) fitted with a disc agitator, reflux condenser, gas inlet and gas outlet. The reaction solution was heated to 150° C. under a nitrogen atmosphere (17 bar) while stirring. At this temperature, air (17 bar) was passed through the solution (180–200 l/h), resulting in the exothermic reaction starting immediately. The reaction temperature was kept at 150° C. by means of external cooling. After about 45 minutes, the exothermic reaction had ended. To allow an after-reaction, an air-nitrogen mixture (10% of $O_2$) was passed through the reaction mixture at 150° C. for 30 minutes. The introduction of air was then stopped and nitrogen was passed into the mixture.

The contents of the reactor were cooled to 100° C. under a nitrogen atmosphere, drained as solution into a flask and cooled to 20° C. while stirring, as a result of which the product crystallized out. The colorless crystal slurry was filtered with suction and the crystals were washed four times with 50 g each time of glacial acetic acid.

Drying gave 118.2 g of 2,5-dibromoterephthalic acid (73%).

Melting point: 316–318° C.

$^1$H-NMR (DMSO): [ppm]=13.5 (br, 2H, COOH), 8.01 (s, 2H, H-aryl).

c) Synthesis of diethyl 2,5-dibromoterephthalate 2,5-Dibromoterephthalic acid (290 g, 895 mmol) together with 150 ml of EtOH were placed in a reaction vessel under protective gas and then admixed at RT with $H_2SO_4$ (8.8 g) while stirring. The mixture was subsequently refluxed at an internal temperature of 78° C. and EtOH was distilled off until the internal temperature was above 100° C. Further ethanol was added, and this was then distilled off again. The procedure was repeated until only the diester was present according to TLC. Finally, all the ethanol was taken off and about 250 ml of heptane were added to the still hot reaction product. The mixture was allowed to crystallize while stirring. The crystals were filtered off with suction, slurried again in 500 ml of heptane by means of an Ultra-Turrax and once more filtered with suction.

This gave 307 g (90%) of colorless crystals.

Melting point: 124° C.

$^1$H-NMR (CDCl$_3$): [ppm]=8.02 (s, 2H, H-aryl), 4.42 (q, 4H, OCH$_2$, J=7.5 Hz), 1.42 (t, 6H, CH$_3$, J=7.5 Hz).

EXAMPLE A2

Synthesis of diethyl 2-bromo-5-chloroterephthate cf. description in WO99/24526

B. Synthesis of Compounds of the Formula (VI)

EXAMPLE B1

Synthesis of 3-(3,7-dimethyloctyloxy)benzeneboronic acid

EXAMPLE B2

Synthesis of 4-(3,7-dimethyloctyloxy)benzeneboronic acid

EXAMPLE B3

Synthesis of 3,4-bis(2-methylpropyloxy)benzeneboronic acid

EXAMPLE B4

Synthesis of 2,5-dimethoxybenzeneboronic acid

EXAMPLE B5

Synthesis of 2,5-dimethylbenzeneboronic acid in each case, see the description in WO99/24526

EXAMPLE B6

Synthesis of 3,4-bis(2-methylbutyloxy)benzeneboronic acid a) Synthesis of 1,2-bis(2-methylbutyloxy)benzene:

Catechol (165.17 g, 1.5 mol) together with 600 ml of ethanol was placed in a reaction vessel, admixed with 149 g of KOH (2.25 mol, dissolved in 210 ml of water) and heated to reflux. 194 g (1.6 mol) of 2-methylbutyl tosylate (prepared from 2-methylbutanol and tosyl chloride) were subsequently added dropwise. After refluxing for a further 3 hours, the same amounts of KOH and 2-methylbutyl tosylate were added again and the mixture was refluxed overnight. The solvent was subsequently removed on a rotary evaporator, the solid reaction residue was taken up in water and toluene and the phases were finally separated. The aqueous phase was washed once more with toluene, the combined organic phases were washed with water and dried over Na$_2$SO$_4$. The low-viscosity crude product obtained after taking off the solvent was fractionally distilled under reduced pressure.

This gave the product as a colorless oil (boiling point 1.09° C. at 0.18 mbar): 247 g (66%).

$^1$H-NMR (CDCl$_3$): [ppm]=6.88 (ps-s, 4H, H-aryl), 3.80 (m, 4H, O—CH$_2$), 1.90 (m, 2 H, C—H), 1.59 (m, 2H, C—H), 1.28 (m, 2H, C—H), 1.04 (d, 6H, CH$_3$, J=8 Hz), 0.94 (t, 6H, CH$_3$, J=8 Hz).

b) Synthesis of 3,4-bis(2-methylbutyloxy)bromobenzene:

1,2-Bis(2-methylbutyloxy)benzene (338 g, 1.35 mol) together with 2.5 l of acetonitrile was placed in a reaction vessel, cooled to 0° C. and admixed with 264 g (1.48 mol) of N-bromosuccinimide. The mixture was warmed to RT and stirred for another 90 minutes. After taking off the acetonitrile, the residue was admixed with toluene and water and the phases were separated. After shaking the aqueous phase with toluene and drying the organic phase over Na$_2$SO$_4$, the toluene was taken off. The crude product was purified by double fractional distillation under reduced pressure. This gave the product as a colorless oil (145° C., 1.3 mbar): 275 g (62%).

$^1$H-NMR (CDCl$_3$): [ppm]=6.98 (m, 2H, H-2, H-6), 6.73 (m, 1H, H-5), 3.77, (m, 4H, O—CH$_2$), 1.90 (m, 2H, C—H), 1.57 (m, 2H, C—H), 1.28 (m, 2H, C—H), 1.04 (m, 6H, CH$_3$), 0.94 (m, 6H, CH$_3$).

c) Synthesis of 3,4-bis(2-methylbutyloxy)benzeneboronic acid:

This was carried out by a method analogous to example B3 in WO99/24526.

Yield: 76%

$^1$H-NMR (CDCl$_3$): [ppm]=7.82 (dd, 1H, H-6, J1=8 Hz, J2=1.8 Hz), 7.69 (d, 1H, H-2, J=1.8 Hz), 7.01 (d, 1H, H-5, J=8 Hz), 3.93 (m, 4H, O—CH$_2$), 1.95 (m, 2H, C—H), 1.62 (m, 2H, C—H), 1.30 (m, 2H, C—H), 1.05 (m, 6H, CH$_3$), 0.97 (m, 6H, CH$_3$).

Contains variable amounts of anhydrides.

EXAMPLE B7

Benzeneboronic Acid

EXAMPLE B8

3-Methoxybenzeneboronic Acid

These two compounds were purchased from ALDRICH.

C.1. Coupling Reactions in Accordance with Reaction A

EXAMPLE C1

Synthesis of diethyl 2,5-bis[3,4-bis(2-methylpropyloxy)phenyl]terephthalate

This was carried out by a method analogous to example C1 in WO99/24526. Starting materials: 1 equivalent of A1 and 2.2 equivalents of B3.

Yield: 96% of a wax-like solid.

$^1$H-NMR (CDCl$_3$): [ppm]=7.72 (s, 2H, H-3, H-6), 6.88 (m, 6H, H-aryl), 4.13 (q, 4H, CO$_2$CH$_2$, J=7.5 Hz), 3.80, 3.75 (2×d, 2×4H, O—CH$_2$, J=7.6 Hz), 2.13 (m, 4H, C—H), 1.04 (m, 24+6H, Me).

EXAMPLE C2

Synthesis of diethyl 2,5-bis[3-(3,7-dimethyloctyloxy)phenyl]terephthalate

This was carried out by a method analogous to example C1. Starting materials: 1 equivalent of A1 and 2.2 equivalents of B1.

Yield: 100% of a yellowish, viscous oil.

EXAMPLE C3

Synthesis of diethyl 2,5-bis[3,4-bis(2-methylbutyloxy)phenyl]terephthalate

This was carried out by a method analogous to example C1. Starting materials: 1 equivalent of A1 and 2.2 equivalents of B6.

Yield: 95% of a viscous oil which solidifies overnight.

Melting point: 70° C.

$^1$H-NMR (CDCl$_3$): [ppm]=7.73 (s, 2H, H-3'/6'), 6.88 (m, 6H, H-aryl), 4.13 (q, 4H, CO$_2$CH$_2$, J=7.5 Hz), 3.83 (m, 8H, O—CH$_2$), 1.93 (m, 4H, C—H), 1.60 (m, 4H, C—H), 1.31 (m, 4H, C—H), 1.05 (m, 12+6H, CH$_3$, CO$_2$CH$_2$CH$_3$), 0.96 (m, 12H, CH$_3$).

EXAMPLE C4

Synthesis of diethyl 2,5-diphenylterephthalate

This was carried out by a method analogous to example C1. Starting materials: 1 equivalent of A1 and 2.2 equivalents of B7.

Yield: 98% of a granular solid.

EXAMPLE C5

Synthesis of diethyl 2,5-bis[3-methoxyphenyl]terephthalate

This was carried out by a method analogous to example C1. Starting materials: 1 equivalent of A1 and 2.2 equivalents of B8.

Yield: 99% of a wax-like solid.

EXAMPLE C6

Synthesis of diethyl 2,5-bis[4-(3,7-dimethyloctyloxy)phenyl]terephthalate

This was carried out by a method analogous to example C1. Starting materials: 1 equivalent of A1 and 2.2 equivalents of B2.

Yield: 92% of an oil which solidifies slowly.

EXAMPLE C7

Synthesis of diethyl 2,5-bis(2,5-dimethylphenyl)terephthalate

This was carried out by a method analogous to example C1. Starting materials: 1 equivalent of A1 and 2.2 equivalents of B5.

Yield: 97% of a brown wax-like solid.

Melting point: 158° C.

$^1$H-NMR (CDCl$_3$): [ppm]=7.79 (s, 2H, H-3', H-6'), 7.11 (m, 4H, H-3, H4, H-3'', H-4''), 6.98 (m, 2H, H-6, H-6''), 4.07 (q, 4H, CO$_2$CH$_2$, J=7.1 Hz), 2.34 (s, 6H, CH$_3$), 2.09 (s, 6H, CH$_3$), 0.99 (t, 6H, CO$_2$CH$_2$CH$_3$, J=7.1 Hz).

EXAMPLE C8

Synthesis of diethyl 5-chloro-2-(2',5'-dimethylphenyl)terephthalate

This was carried out by a method analogous to example C1. Starting materials: 1 equivalent of A2 and 1.1 equivalents of B5.

Yield: 98% of a colorless, low-viscosity oil.

$^1$H-NMR (CDCl$_3$): [ppm]=7.99, 7.67 (s, 2H, H-3, H-6), 7.10 (m, 2H, H-3', H-4'), 6.88 (br. s, 1H, H-6'), 4.40 (q, 2H, CO$_2$CH$_2$, J=7.2 Hz), 4.07 (q, 2H, CO$_2$CH$_2$, J=7.2 Hz, 2.32 (s, 3H, CH$_3$), 2.02 (s, 3H, CH$_3$), 1.39 (t, 3H, CO$_2$CH$_2$CH$_3$, J=7.2 Hz), 0.99 (t, 3H, CO$_2$CH$_2$CH$_3$, J=7.2 Hz).

C.2. Coupling Reactions in Accordance with Reaction A'

EXAMPLE C9

Synthesis of diethyl 2-(2,5-dimethylphenyl)-5-(3,4-(2-methylbutyloxy)phenyl)terephthalate A mixture of diethyl 5-chloro-2-(2',5'-dimethylphenyl) terephthalate (137 g, 0.38 mol), 3,4-bis(2-methylbutyloxy) benzeneboronic acid (144 g, 0.49 mol), anhydrous cesium carbonate (212 g, 0.65 mol) and 500 ml of dry dioxane was degassed in a stream of argon for 30 minutes while stirring. Subsequently, tri-tert-butylphosphine (2.4 g, 12 mmol) and then palladium(II) acetate (1.3 g, 6 mmol) were added. The suspension was stirred at 70° C. under an argon atmosphere for 16 hours. A solution of N,N-diethyldithiocarbamic acid sodium salt trihydrate (5 g, 22 mmol) in 100 ml of water was added to the reaction solution at 70° C. After cooling the reaction mixture, the organic phase was separated off. The aqueous phase was extracted twice with 100 ml of ethyl acetate. The combined organic phases were subsequently filtered through Celite. The filtrate was washed with 200 ml of water and with 200 ml of saturated, aqueous sodium chloride solution and dried over sodium sulfate. Filtering off the desiccate and removing the volatile organic constituents under reduced pressure ($10^{-1}$ mbar, 80° C., 6 h) gave 206 g (95%) of a highly viscous oil.

$^1$H-NMR (CDCl$_3$): [ppm]=7.92, 7.59 (s, 2H, H-3', H-6'), 7.10, 6.90 (m, 6H, H-3, H-4, H-6, H-2", H-5", H-6"), 4.14 (q, 2H, CO$_2$CH$_2$, J=7.1 Hz), 4.06 (q, 2H, CO$_2$CH$_2$, J=7.1 Hz), 3.84 (m, 4H, OCH$_2$), 2.33, 2.08 (s, 6H, CH$_3$), 1.93 (m, 2H, CH), 1.61 (m, 2H, CH$_2$), 1.31 (m, 2H, CH$_2$), 1.06 (m, 6+6H, CH$_3$, CO$_2$CH$_2$CH$_3$), 0.96 (m, 6H, CH$_3$).

D. Reductions in Accordance with Reaction B

EXAMPLE D1

Synthesis of 3,4,3",4"-tetrakis(2-methylpropyloxy)-p-terphenyl-2',5'-dimethanol

This was carried out by a method analogous to example D1 in WO99/24526. Starting material: C1.

Yield after stirring out: 75%.

Melting point: 161° C.

$^1$H-NMR (CDCl$_3$): [ppm]=7.44 (s, 2H, H-3', H-6'), 6.94 (m, 6H, H-aryl), 4.67 (s, 4H, CH$_2$—O), 3.79, 3.76 (2×d, 2×4H, O—CH$_2$, J=7.6 Hz), 2.13 (m, 4H, C—H), 1.06, 1.03 (2×d, 2×12H, CH$_3$, J=7.4 Hz).

EXAMPLE D2

Synthesis of 3,3"-bis(3,7-dimethyloctyloxy)-p-terphenyl-2',5'-dimethanol

This was carried out by a method analogous to example D1. Starting material: C2.

Yield after stirring out: 91%.

$^1$H-NMR (CDCl$_3$): [ppm]=7.48 (s, 2H, H-3'/6'), 7.33 (t; 2H; J=8 Hz; H-5/5"), 6.96 (m; 6H; H-2/2", H-4/4", H-6/6"), 4.68 (s, 4H, CH$_2$O), 4.03 (m, 4H, O—CH$_2$), 1.85 (m, 2H, H-3), 1.60 (m, 6H, H-2, H-7), 1.25 (m, 12H, H-4, H-5, H-6), 0.95 (d, 6H, Me, J=7.5 Hz), 0.86 (d, 12H, Me, J=7.5 Hz).

EXAMPLE D3

Synthesis of 3,4,3",4"-tetrakis(2-methylbutyloxy)-p-terphenyl-2',5'-dimethanol

This was carried out by a method analogous to example D1. Starting material: C3.

Yield after stirring out: 71%.

$^1$H-NMR (CDCl$_3$): [ppm]=7.45 (s, 2H, H-3'/6'), 6.94 (m, 6H, H-aryl), 4.66 (s, 4H, CH$_2$—O), 3.84 (m, 8H, O—CH$_2$), 1.94 (m, 4H, C—H), 1.60 (m, 4H, C—H), 1.30 (m, 4H, C—H), 1.05 (m, 12H, CH$_3$), 0.97 (m, 12H, CH$_3$).

EXAMPLE D4

Synthesis of p-terphenyl-2',5'-dimethanol

This was carried out by a method analogous to example D1. Starting material: C4.

Yield after stirring out: 88%.

$^1$H-NMR (CDCl$_3$): [ppm]=7.44 (s, 2H, H-3'/6'), 7.35, 7.15 (2×m, 4+6H, H-aryl), 4.63 (s, 4H, CH$_2$—O).

EXAMPLE D5

Synthesis of 3,3"-bis(methoxy)-p-terphenyl-2',5'-dimethanol

This was carried out by a method analogous to example D1. Starting material: C5.

Yield after stirring out: 95%.

$^1$H-NMR (CDCl$_3$): [ppm]=7.48 (s, 2H, H-3'/6'), 7.32 (t; 2H; J=8 Hz; H-5/5"), 6.96 (m; 6H; H-2/2", H-4/4", H-6/6"), 4.67 (s, 4H, CH$_2$—O), 3.78 (s, 6H, O—CH$_3$).

EXAMPLE D6

Synthesis of 4,4"-bis(3,7-dimethyloctyloxy)-p-terphenyl-2',5'-dimethanol

This was carried out by a method analogous to example D1. Starting material: C6.

Yield after stirring out: 87%.

$^1$H-NMR (CDCl$_3$): [ppm]=7.46 (s, 2H, H-3'/6'), 7.29, 6.96 (AA'BB'; 8H; H-aryl), 4.67 (s, 4H, CH$_2$O), 4.02 (m, 4H, O—CH$_2$), 1.86 (m, 2H, H-3), 1.61 (m, 6H, H-2, H-7), 1.25 (m, 12H, H-4, H-5, H-6), 0.95 (d, 6H, Me, J=7.5 Hz), 0.87 (d, 12H, Me, J=7.5 Hz).

EXAMPLE D7

Synthesis of 2,5,2",5"-tetrakis(methyl)-p-terphenyl-2',5'-dimethanol

This was carried out by a method analogous to example D1, with the work-up described below. Starting material: C7.

For the work-up, 8 ml of water were carefully added after the reduction was complete. Subsequently, 8 ml of aqueous NaOH solution (15% strength) and finally 24 ml of water were added. After each addition, the mixture was stirred for about 15 minutes ("1:1:3 method"). The solid which had precipitated was filtered off with suction, washed with 250 ml of THF and dried. After drying, the solid was digested in 500 ml of DMSO at 150° and then filtered while still hot. The residue on the filter was discarded. Cooling the filtrate resulted in precipitation of a crystalline, colorless solid which was filtered off with suction and washed with 100 ml of cold DMSO. The solid was subsequently stirred with 200 ml of acetone, filtered off with suction and dried.

Yield: 41 g (80%).

$^1$H-NMR (DMSO-d$_6$): [ppm]=7.20 (m, 4H, H-3, H-4, H-3", H-4"), 7.09 (m, 2H, H-6, H-6"), 6.95 (s, 2H, H-3', H-6'), 4.97 (m, 2H, OH), 4.18 (m, 4H, CH$_2$O), 2.30 (s, 6 H, CH$_3$), 2.08, 2.00 (s, 6H, CH$_3$).

EXAMPLE D8

Synthesis of 2,5-dimethyl-3",4"-(2-methylbutyloxy)-p-terphenyl-2',5'-dimethanol

This was carried out by a method analogous to example D1. Starting material: C9.

Yield after stirring out: 72%.

$^1$H-NMR (CDCl$_3$): [ppm]=7.43, 7.27 (s, 2H, H-3', H-6'), 7.16, 7.08 (m, 2H, H-6, H-2"), 6.07, 6.92 (m, 4H, H-3, H-4, H-5", H-6"), 4.63 (d, 2H, CH$_2$O, J=5.9 Hz), 4.43 (d, 2H, CH$_2$O, J=. 6.0 Hz), 3.87, 3.82 (m, 4H, OCH$_2$), 2.32, 2.06 (s, 6H, CH$_3$), 1.92 (m, 2H, CH), 1.74 (t, 1H, OH, J=5.9 Hz), 1.64 (t, 1H, OH, J=6.0 Hz), 1.60 (m, 2 H, CH$_2$), 1.31 (m, 2H, CH$_2$), 1.05 (m, 6H, CH$_3$), 0.96 (m, 6H, CH$_3$).

E. Halogenations in Accordance with Reaction C

EXAMPLE E1

Synthesis of 3,4,3'',4''-tetrakis(2-methylpropyloxy)-2',5'-dichloromethyl-p-terphenyl 265 g (458 mmol) of D1 were dissolved in 500 ml of dioxane and, at RT, a solution of 218 g (1.8 mol) of thionyl chloride in 130 ml of dioxane was added dropwise. The mixture was stirred overnight at RT. It was then neutralized with NaHCO$_3$ solution; the (clean) product which had precipitated was filtered off with suction. Further product is obtained by phase separation, shaking with water, taking off the organic solvent and finally stirring with hexane.

Total yield after stirring out: 206 g (73%).
Melting point: 126° C.
$^1$H-NMR (CDCl$_3$): [ppm]=7.46 (s, 2H, H-3'/6'), 7.03, 6.95 (2×m, 2+4H, H-aryl), 4.56 (s, 4H, CH$_2$Cl), 3.82, 3.80 (2×d, 2×4H, O—CH$_2$, J=7.7 Hz), 2.15 (m, 4H, C—H), 1.07, 1.04 (2×d, 2×12H, CH$_3$, J=7.5 Hz).

EXAMPLE E2

Synthesis of 3,3''-bis(3,7-dimethyloctyloxy)-2',5'-dichloromethyl-p-terphenyl

This was carried out by a method analogous to example E1. Starting material: D2.
Yield after stirring out: 84%.
Melting point: 66° C.
$^1$H-NMR (CDCl$_3$): [ppm]=7.48 (s, 2H, H-3'/6'), 7.36 (pseudo-t; 2H; J=8 Hz; H-5/5''), 7.02, 6.95 (2×m; 4+2H; H-2/2'', H-4/4'', H-6/6''), 4.55 (s, 4H, CH$_2$Cl), 4.05 (m, 4H, O—CH$_2$), 1.86 (m, 2H, H-3), 1.60 (m, 6H, H-2, H-7), 1.25 (m, 12H, H-4, H-5, H-6), 0.95 (d, 6H, Me, J=7.5 Hz), 0.87 (d, 12H, Me, J=7.5 Hz).

EXAMPLE E3

Synthesis of 3,4,3'',4''-tetrakis(2-methylbutyloxy)-2',5'-dichloromethyl-p-terphenyl This was carried out by a method analogous to example E1. Starting material: D3 The product is obtained in clean form as an oil which crystallizes slowly.
Yield: 87%.
Melting point: 56° C.
$^1$H-NMR (CDCl$_3$): [ppm]=7.45 (s, 2H, H-3'/6'), 7.03, 6.95 (2×m, 2+4H, H-aryl), 4.56 (s, 4H, CH$_2$Cl), 3.86 (m, 8H, O—CH$_2$), 1.93 (m, 4H, C—H), 1.61 (m, 4H, C—H), 1.32 (m, 4H, C—H), 1.06 (m, 12H, CH$_3$), 0.97 (m, 12H, CH$_3$).

EXAMPLE E4

Synthesis of 2',5'-dichloromethyl-p-terphenyl

This was carried out by a method analogous to example E1. Starting material: D4 The product is obtained in clean form as colorless crystals.
Yield: 89%.
Melting point: 214° C.
$^1$H-NMR (CDCl$_3$): [ppm]=7.47 (s, 2H, H-3'/6'), 7.32, 7.13 (2×m, 4+6H, H-aryl), 4.54 (s, 4H, CH$_2$Cl).

EXAMPLE E5

Synthesis of 3,3''-bismethoxy-2',5'-dichloromethyl-p-terphenyl

This was carried out by a method analogous to example E1. Starting material: D5.
Yield after stirring out: 82%.
Melting point: 145° C.
$^1$H-NMR (CDCl$_3$): [ppm]=7.47 (s, 2H, H-3'/6'), 7.34 (pseudo-t; 2H; J=8 Hz; H-5/5''), 7.01, 6.95 (2×m; 4+2H; H-2/2'', H-4/4'', H-6/6''), 4.55 (s, 4H, CH$_2$Cl), 3.75 (s, 6H, O—CH$_3$).

EXAMPLE E6

Synthesis of 4,4''-bis(3,7-dimethyloctyloxy)-2',5'-dichloromethyl-p-terphenyl

This was carried out by a method analogous to example E1. Starting material: D6.
Yield after stirring out: 84%.
Melting point: 118° C.
$^1$H-NMR (CDCl$_3$): [ppm]=7.48 (s, 2H, H-3'/6'), 7.30, 6.97 (AA'BB'; 8H; H-aryl), 4.55 (s, 4H, CH$_2$Cl), 4.04 (m, 4H, O—CH$_2$), 1.86 (m, 2H, H-3), 1.60 (m, 6H, H-2, H-7), 1.26 (m, 12H, H-4, H-5, H-6), 0.95 (d, 6H, Me, J=7.5 Hz), 0.86 (d, 12H, Me, J=7.5 Hz).

EXAMPLE E7

Synthesis of 2,5,2'',5''-tetrakis(methyl-2',5'-dichloromethyl)-p-terphenyl

This was carried out by a method analogous to example E1, using a suspension of D7 in 1 000 ml of dioxane in place of the solution described in example E1. Starting material: D7.
Yield after stirring out: 84%.
Melting point: 114° C.
$^1$H-NMR (CDCl$_3$): [ppm]=7.34 (s, 2H, H-3', H-6'), 7.19, 7.12, 7.06 (m, 6H, H-3, H-4, H-6, H-3'', H-4'', H-6''), 4.36 (m, 4H, CH$_2$Cl), 2.36 (s, 6H, CH$_3$), 2.10, 2.08 (s, 6H, CH$_3$).

EXAMPLE E8

Synthesis of 2,5-dimethyl-3'',4''-(2-methylbutyloxy)-2',5'-dichloromethyl-p-terphenyl This was carried by a method analogous to example E1. Starting material: D8 After removal of the volatile organic constituents under reduced pressure (10$^{-1}$ mbar, 60° C., 6 h), the product is obtained in clean form as a highly viscous colorless oil.
Yield: 99%.
$^1$H-NMR (CDCl$_3$): [ppm]=7.48, 7.32 (s, 2H, H-3', H-6''), 7.19, 7.12 (m, 2H, H-6, H-2''), 7.04, 6.96 (m, 4H, H-3, H-4, H-5'', H-6''), 4.55 (s, 2H, CH$_2$Cl), 4.43, 4.32 (d, 2 H, CH$_2$Cl, J=11.5 Hz), 3.92, 3.84 (m, 4H, OCH$_2$), 2.35, 2.10 (s, 6H, CH$_3$), 1.95 (m, 2H, CH), 1.61 (m, 2H, CH$_2$), 1.32 (m, 2H, CH$_2$), 1.06 (m, 6H, CH$_3$), 0.97 (m, 6H, CH$_3$).

Z. Synthesis of Comonomers

The synthesis of various comonomers (such as those which are in the present patent application designated by way of example as comonomers A to Y) is described comprehensively and in detail in the two patent publications WO98/27136 and WO99/24526.

Part 2: Synthesis and Characterization of the Polymers:

The composition of the copolymers P1 and P2 was confirmed by oxidative degradation and subsequent qualitative and quantitative analysis of the monomer units obtained again in this way. It was found that the proportion of monomer units in the copolymer was equal to the monomer ratio employed in the synthesis.

P: Synthesis of Polymers According to the Invention:

EXAMPLE P1

Copolymer of 30% of E2 and 70% of 2,5-bis(chloromethyl)-3'-(3,7-dimethyloctyloxy)biphenyl (polymer P1)

Preparation of poly(2,5-bis[3'-(3,7-dimethyloctyloxy)phenyl]-p-phenylenevinylene)co(2-(3'-(3,7-dimethyloctyloxy)phenyl)-p-phenylenevinylene)

The preparation of the polymer P1 was carried by a method analogous to example P1 in WO99/24526. 7.28 g (11.38 mmol) of 3,3''-bis(3,7-dimethyloctyloxy)-2',5'-dichloromethyl-p-terphenyl (example E2) and 10.82 g (26.55 mmol) of 2,5-bis(chloromethyl)-3'-(3,7-dimethyloctyloxy)biphenyl (see WO99/24526, example Z3 c) were reacted with a total of 189.8 ml of 1 M KOtBu in a total of 2.3 l of 1,4-dioxane. Analogous purification gave 8.1 g (53%) of the polymer P1 as yellow fibers.

$^1$H-NMR (CDCl$_3$): [ppm]=8.1–6.6 (br. m, 9.9H; olefin-H, arom-H); 4.0 (br. s, 2.6H; O—CH$_2$); 2.7 (br. s; bisbenzyl); 1.94.8 (br. m; 24.7H, alkyl-H).

Integration of the signal at 2.7 μm indicated a content of TBB groups of 7.6%. The $^1$H-NMR spectrum of polymer P1 is shown in FIG. 1a.

GPC: THF+0.25% of oxalic acid; column set SDV500, SDV1000, SDV10000 (from PSS), 35° C., UV detection at 254 nm, polystyrene standard: M$_w$=1.2×10$^6$ g/mol, M$^n$=2.0× 10$^5$ g/mol.

Figure 2:
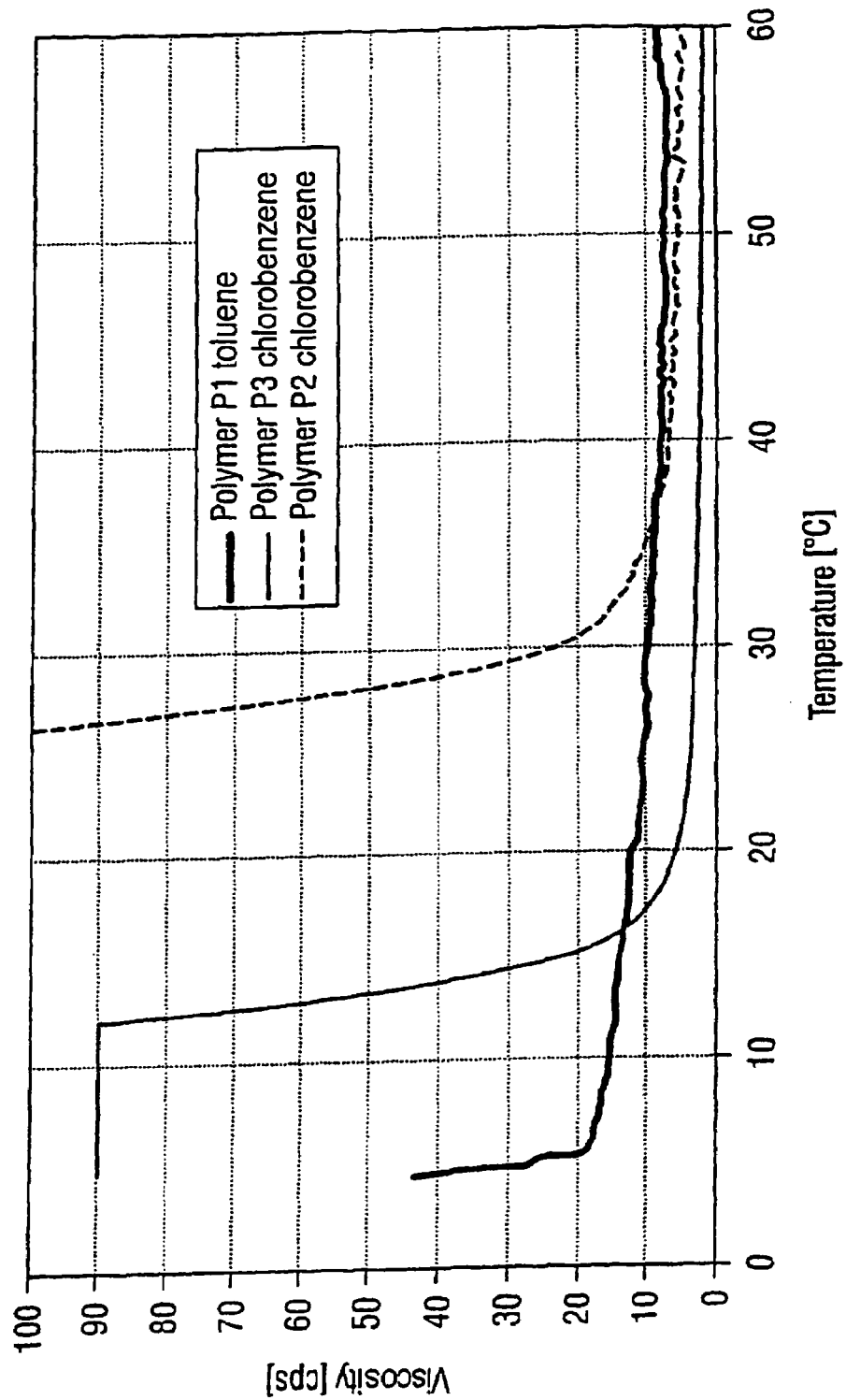
FIG. 2 is a viscosity vs. temperature plot for some solutions of polymers P1, P2 and P3.

A solution of the polymer P1 in toluene having a concentration of 5 mg/ml gels at a temperature of <6° C. (see FIG. 2).

EXAMPLE P2

Copolymer of 50% of E3, 40% of 2,5-bis(chloromethyl)-3'-(3,7-dimethyl-octyloxy) biphenyl and 10% of 2,5-bis(chloromethyl)-2'5'-dimethylbiphenyl (polymer P2)

Preparation of poly(2,5-bis(3',4'-bis[2-methylbutyloxyphenyl])-p-phenylenevinylene)co(2-(3'-(3,7-dimethyloctyloxy)phenyl)-p-phenylenevinylene)co(2-(2',5'-dimethylphenyl-p-phenylenevinylene)

The preparation of the polymer P2 was carried out by a method analogous to example P1 in WO99/24526. 12.75 g (18.97 mmol) of 3,4,3'',4''-tetrakis(2-methylbutyloxy)-2',5'-dichloromethyl-p-terphenyl (example E3), 6.18 g (15.17 mmol) of 2,5-bis(chloromethyl)-3'-(3,7-dimethyloctyloxy) biphenyl and 1.08 g (3.79 mmol) of 2,5-bis(chloromethyl)-2',5'-dimethylbiphenyl (see WO98/27136, example E4) were reacted with a total of 191 ml of 1 M KOtBu in a total of 2.3 l of 1,4-dioxane. Analogous purification gave 9.44 g (55%) of the polymer P2 as a yellow fibrous polymer.

$^1$H-NMR (CDCl$_3$): [ppm]=7.8–6.7 (br. m, 9.4H; olefin-H, arom-H); 4.1–3.5 (br. m, 4.8H; O—CH$_2$); 2.8–2.7 (br. s; bisbenzyl); 2.3 (m, 0.3H, 1×CH$_3$); 2.0–0.8 (br. m; 16.9H, alkyl-H and 1×CH$_3$).

Integration of the signal at 2.8–2.7 ppm indicated a content of TBB groups of 3.9%.

The $^1$H-NMR spectrum of polymer P2 is shown in FIG. 1a.

GPC: THF+0.25% of oxalic acid; column set SDV500, SDV1000, SDV10000 (from PSS), 35° C., UV detection at 254 nm, polystyrene standard: M$_w$=1.8×10$^6$ g/mol, M$^n$=2.0× 10$^5$ g/mol.

A solution of the polymer P2 in chlorobenzene having a concentration of 5 mg/ml gels at a temperature of <32° C. (see FIG. 2).

EXAMPLE P3

Copolymer of 40% of E2 and 60% of 2,5-bis(chloromethyl)-3'-(3,7-dimethyloctyloxy)biphenyl (polymer P3)

Preparation of poly(2,5-bis[3-(3,7-dimethyloctyloxy)phenyl]-p-phenylenevinylene)co(2-(3'-(3,7-dimethyloctyloxy)phenyl)-p-phenylenevinylene)

The preparation of the polymer P3 was carried out by a method analogous to example P1 in WO99/24526. 9.71 g (15.18 mmol) of 3,3''-bis(3,7-dimethyloctyloxy)-2',5'-dichloromethyl-p-terphenyl (example E2) and 9.28 g (22.77 mmol) of 2,5-bis(chloromethyl)-3'-(3,7-dimethyloctyloxy) biphenyl were reacted with a total of 189.9 ml of 1 M KOtBu in a total of 2.3 l of 1,4-dioxane. Analogous work-up and purification gave 9.32 g (57%) of the polymer P3 as yellow fibers.

$^1$H-NMR (CDCl$_3$): [ppm]=8.1–6.6 (br. m, 10.2H; olefin-H, arom-H); 4.0 (br. s, 2.8H; O—CH$_2$); 2.7 (br. s; bisbenzyl); 1.9–0.8 (br. m; 26.6H, alkyl-H).

Figure 1B:
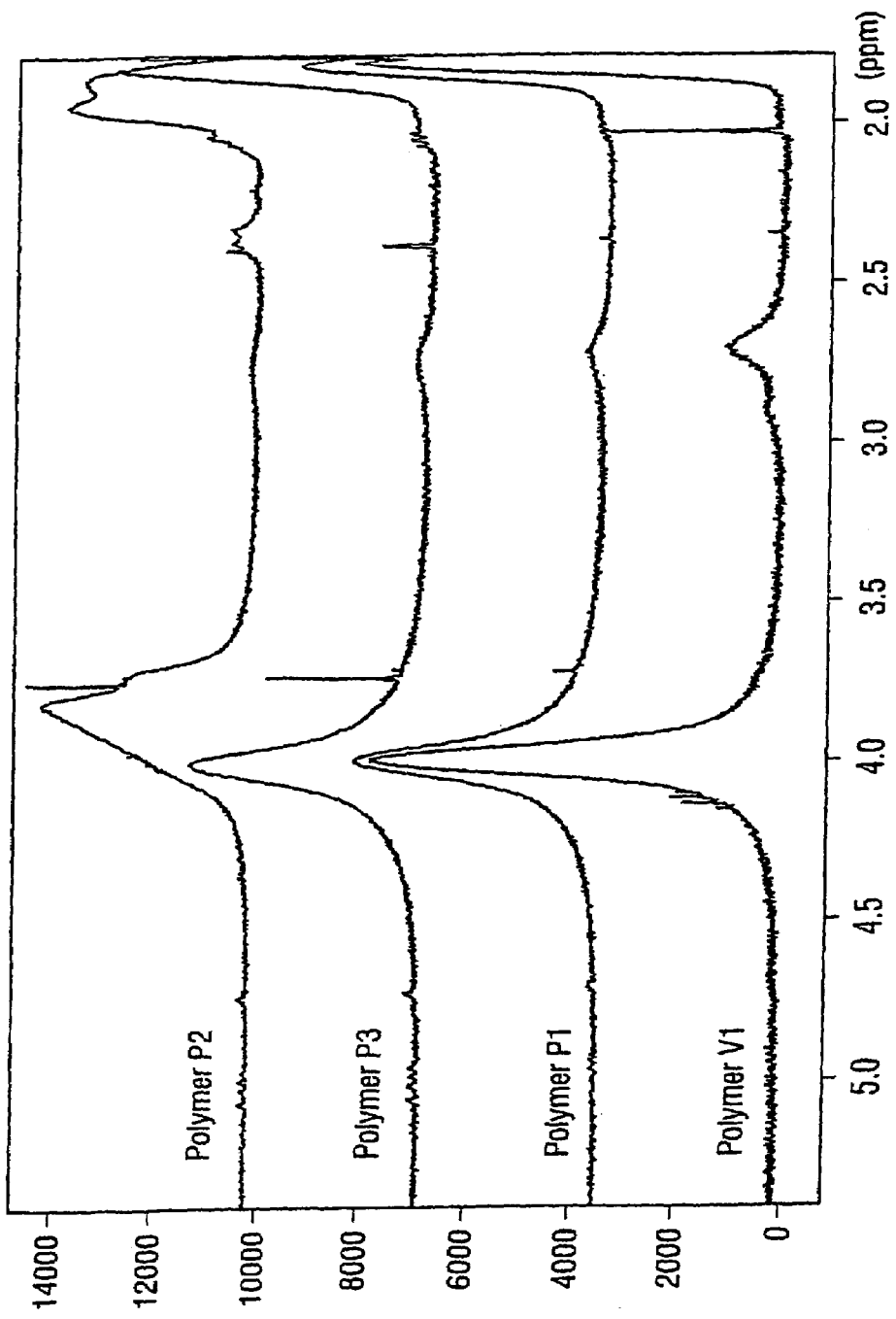

Integration of the signal at 2.7 ppm indicated a content of TBB groups of 6.7%. The $^1$H-NMR spectrum of polymer P3 is shown in FIG. 1.

GPC: THF+0.25% of oxalic acid; column set SDV500, SDV1000, SDV10000 (from PSS), 35° C., UV detection at 254 nm, polystyrene standard: M$_w$=1.7×10$^6$ g/mol, M$^n$=3.0× 10$^5$ g/mol.

A solution of the polymer P3 in chlorobenzene having a concentration of 5 mg/ml gels at a temperature of <16° C. (see FIG. 2).

EXAMPLE P4

HB972

Copolymer of 20% of E3, 20% of E4 and 60% of 2,5-bis(chloromethyl)-3',4'-bis(2-methylpropyloxy) biphenyl (polymer P4): HB 1200

Preparation of poly[(2-(3',4'-bis(2-methylpropyloxy)phenyl)-p-phenylene vinylene)co(2,5-bis(3,4-bis(3-methylbutyloxy)phenyl)-p-phenylenevinylene)co(2,5-bis(2,5-dimethylphenyl)-p-phenylenevinylene)]

The preparation of the polymer P4 was carried out by a method analogous to example P1. 7.65 g (11.38 mmol) of 3,4,3'',4''-tetrakis(2-methylbutyloxy)-2',5'-dichloromethylp-terphenyl (example E3), 4.36 g (11.38 mmol) of 2,5,2",5"tetrakis(methyl-2',5'-dichloromethyl)-p-terphenyl (example E4), 13.50 g (34.15 mmol) of 2,5-bis(chloromethyl)-3',4'-bis(2-methylpropyloxy)biphenyl were reacted with a total of 286 ml of 1 M KOtBu in a total of 3.5 l of 1,4-dioxane. Analogous purification gave 12.14 g (57%) of the polymer P4 as a yellow fibrous polymer.

$^1$H-NMR (CDCl$_3$): [ppm]=7.8–6.6 (br. m, 8.8H; olefin-H, arom-H); 3.7 (br. s, 4.0H; O—CH$_2$); 2.8–2.7 (br. s; bisbenzyl); 2.24–0.8 (br. m; 18.0H, alkyl-H and 2×CH$_3$).

Integration of the signal at 2.8–2.7 ppm indicated a content of TBB groups of 4%.

GPC: THF+0.25% of oxalic acid; column set SDV500, SDV1000, SDV10000 (from PSS), 35° C., UV detection at 254 nm, polystyrene standard: M$_w$=1.8×10$^6$ g/mol, M$^n$=3.6×10$^5$ g/mol.

EXAMPLE P5

Copolymer of 40% of E8 and 60% of 2,5-bis(chloromethyl)-3',4'-bis(2-methylpropyloxy)biphenyl (polymer P5): HB 1205

Preparation of poly[(2-(3',4'-bis(2-methylpropyloxy)phenyl)-p-phenylenevinylene)co(2-(3,4-bis(3-methylbutyloxy)phenyl)-5-(2,5-bismethyl)phenyl-p-phenylenevinylene)]

The preparation of the polymer P5 was carried out by a method analogous to example P1. 12.01 g (22.77 mmol) of 2,5-dimethyl-3",4"-(2-methylbutyloxy)-2',5'-dichloromethyl-p-terphenyl (example E8) and 13.50 g (34.15 mmol) of 2,5-bis(chloromethyl)-3',4'-bis(2-methylpropyloxy)biphenyl were reacted with a total of 285 ml of 1 M KOtBu in a total of 3.4 l of 1,4-dioxane. Analogous work-up and purification gave 10.25 g (48%) of the polymer P5 as a yellow powder.

$^1$H-NMR (CDCl$_3$): [ppm]=7.9–6.7 (br. m; 8.8H; olefin-H, arom-H); 3.8 (br. s, 4.0H; O—CH$_2$); 2.8–2.7 (br. s; bisbenzyl); 2.25–0.7 (br. m; 18.0H, alkyl-H and 2×CH$_3$).

Integration of the signal at 2.8–2.7 ppm indicated a content of TBB groups of 5%.

GPC: THF+0.25% of oxalic acid; column set SDV500, SDV1000, SDV10000 (from PSS), 35° C., UV detection at 254 nm, polystyrene standard: M$_w$=1.2×10$^6$ g/mol, M$^n$=2.5×10$^5$ g/mol. In a 0.5% strength solution in toluene, the polymer displays no gelling to at least 0° C.

EXAMPLE P6

Copolymer of 25% of E3, 25% of E4, 25% of 2,5-bis(chloromethyl)-3',4'-bis(2-methylpropyloxy)biphenyl and 25% of 2,5-bis(chloromethyl)-3',4'-bis(2-methylbutyloxy)biphenyl (polymer P6): HB 1221

Preparation of poly[(2-(3',4'-bis(2-methylpropyloxy)phenyl)$_p$-phenylenevinylene)co(2-(3',4'-bis(2-methylbutyloxy)phenyl)-p-phenylenevinylene)co(2,5-bis(3,4-bis(3-methylbutyloxy)phenyl)-p-phenylenevinylene)co(2,5-bis(2,5-dimethylphenyl)-p-phenylenevinylene)]

The preparation of the polymer P6 was carried out by a method analogous to examples P1–P5. 9.56 g (14.23 mmol) of 3,4,3",4"-tetrakis(2-methylbutyloxy)-2',5'-dichloromethyl-p-terphenyl (example E3), 5.46 g of (14.23 mmol) of 2,5,2",5"-tetrakis(methyl-2',5'-dichloromethyl)-p-terphenyl (example E4), 5.63 g (14.23 mmol) of 2,5-bis(chloromethyl)-3',4'-bis(2-methylpropyloxy)biphenyl and 6.03 g (14.23 mmol) of 2,5-bis(chloromethyl)-3',4'-bis(2-methylbutyloxy)biphenyl were reacted with a total of 284.6 ml of 1 M KOtBu in a total of 3.45 l of 1,4-dioxane.

Analogous purification gave 9.83 g (44%) of the polymer P6 as a yellow fibrous polymer.

$^1$H-NMR (CDCl$_3$): [ppm]=7.8–6.7 (br. m, 9.0H; olefin-H, arom-H); 4.1–3.6 (br. m, 4.0H; O—CH$_2$); 2.8–2.7 (br. s; bisbenzyl); 2.3–0.8 (br. m; 20.0H, alkyl-H and CH$_3$).

Integration of the signal at 2.8–2.7 ppm indicated a content of TBB groups of 4.2%.

GPC: THF+0.25% of oxalic acid; column set SDV500, SDV1000, SDV10000 (from PSS), 35° C., UV detection at 254 nm, polystyrene standard: M$_w$=2.2×10$^6$ g/mol, M$^n$=3.8×10$^5$ g/mol. In toluene (5 mg/ml), the polymer displays no gelling to <15° C.

EXAMPLE P7

Copolymer of 25% of E3, 25% of E4 and 50% of 2,5-bis(chloromethyl)-3',4'-bis(2-methylbutyloxy)biphenyl (polymer P7): HB 1227

Preparation of poly[(2-(3',4'-bis(2-methylbutyloxy)phenyl)-p-phenylenevinylene)co(2,5-bis(3,4-bis(3-methylbutyloxy)phenyl)-p-phenylenevinylene)co(2,5-bis(2,5-dimethylphenyl)-p-phenylenevinylene)]

The preparation of the polymer P7 was carried out by a method analogous to example P6. 9.56 g (14.23 mmol) of 3,4,3",4"-tetrakis(2-methylbutyloxy)-2',5'-dichloromethyl-p-terphenyl (example E3), 5.46 g (14.23 mmol) of 2,5,2",5"-tetrakis(methyl-2',5'-dichloromethyl-p-terphenyl (example E4) and 12.05 g (28.50 mmol) of 2,5-bis(chloromethyl)-3',4'-bis(2-methylbutyloxy)biphenyl were reacted with a total of 284.6 ml of 1 M KOtBu in a total of 3.45 l of 1,4-dioxane.

Analogous purification gave 10.6 g (46%) of the polymer P7 as a yellow fibrous polymer.

$^1$H-NMR (CDCl$_3$): [ppm]=7.8–6.7 (br. m, 9.0H; olefin-H, arom-H); 4.1–3.6 (br. m, 4.0H; O—CH$_2$); 2.8–2.7 (br. s; bisbenzyl); 2.30–0.8 (br. m; 21.0H, alkyl-H and CH$_3$).

Integration of the signal at 2.8–2.7 ppm indicated a content of TBB groups of 4.9%.

GPC: THF+0.25% of oxalic acid; column set SDV500, SDV1000, SDV10000 (from PSS), 35° C., UV detection at 254 nm, polystyrene standard: M$_w$=2.2×16 g/mol, M$^n$=3.6×10$^5$ g/mol. In toluene (5 mg/ml), the polymer displays no gelling to <18° C.

EXAMPLE P8

Copolymer of 25% of E3, 25% of E4, 24.5% of 2,5-bis(chloromethyl)-3',4'-bis(2-methylpropyloxy)biphenyl, 25% of 2,5-bis(chloromethyl)-3',4'-bis(2-methylbutyloxy)biphenyl, 0.5% of 2,5-bis(chloromethyl)-1-methoxy-4-(3,7-dimethyloctyloxy)benzene (polymer P8): HB 1245

Preparation of poly[(2-(3',4'-bis(2-methylpropyloxy)phenyl)-p-phenylenevinylene)co(2-(3',4'-bis(2-methylbutyloxy)phenyl)-p-phenylenevinylene)co(2,5-bis(3,4-bis(3-methylbutyloxy)phenyl)-p-phenylenevinylene)co(2,5-bis(2,5-dimethylphenyl)-p-phenylenevinylene)co(2-(3,7-dimethyloctyloxy)-5-methoxy)p-phenylenevinylene]

The preparation of the polymer P8 was carried out by a method analogous to examples P1–P5. 9.56 g (14.23 mmol)

of 3,4,3",4"-tetrakis(2-methylbutyloxy)-2',5'-dichloromethyl-p-terphenyl (example E3), 5.46 g (14.23 mmol) of 2,5,2",5"-tetrakismethyl-2',5'-dichloromethyl-p-terphenyl (example E4), 5.51 g (13.94 mmol) of 2,5-bis(chloromethyl)-3',4'-bis(2-methylpropyloxy)biphenyl, 6.03 g (14.23 mmol) of 2,5-bis(chloromethyl)-3',4'-bis(2-methylbutyloxy)biphenyl and 100 mg (0.28 mmol) of 2,5-bis(chloromethyl)-1-methoxy-4-(3,7-dimethyloctyloxy)benzene were reacted with a total of 284.6 ml of 1 M KOtBu in a total of 3.45 l of 1,4-dioxane. Analogous purification gave 11.02 g (49%) of the polymer P7 as yellow-orange fibers.

$^1$H-NMR (CDCl$_3$): [ppm]=7.8–6.5 (br. m, 8.98H; olefin-H, arom-H); 4.0–3.6 (br. m, 4.01H; O—CH$_2$); 2.8–2.7 (br. s; bisbenzyl); 2.3–0.8 (br. m; 20.03H, alkyl-H).

Integration of the signal at 2.8–2.7 ppm indicates a content of TBB groups of 3.2%.

GPC: THF+0.25% of oxalic acid; column set SDV500, SDV1000, SDV10000 (from PSS), 35° C., UV detection at 254 nm, polystyrene standard: $M_w$=1.3×10$^6$ g/mol, $M^n$=2.2×10$^5$ g/mol. In toluene (5 mg/ml), the polymer displays no gelling to <12° C.

V. Synthesis of Comparative Examples not According to the Invention:

EXAMPLE V1

Preparation of poly[2-(3'-(3,7-dimethyloctyloxy)phenyl)-p-phenylenevinylene]

For the preparation of the polymer V1, see comparative example V6 in WO99/24526.

$^1$H-NMR (400 MHz, CDCl$_3$): (ppm)=7.9–7.0 (br. m; 9H; arom-H, olefin-H); 4.0 (br. s, 2H); 2.7 (br. s; bisbenzyl); 1.9–1.1 (br. m, 10H); 0.85, 0.83 (2 s, 9H).

Integration of the signal at 2.7 ppm indicated a content of TBB groups of 12%. The $^1$H-NMR spectrum of polymer V1 is shown in FIG. 1a.

GPC: THF+0.25% of oxalic acid; column set SDV500, SDV1000, SDV10000 (from PSS), 35° C., UV detection at 254 nm, polystyrene standard: $M_w$=1.2×10$^6$ g/mol, $M^n$=1.1×10$^5$ g/mol.

EXAMPLE V2

Copolymer of 50% of 2',5'-bis(chloromethyl)-p-terphenyl (E4) and 50% of 2,5-bis(chloromethyl)-3'-(3,7-dimethyloctyloxy)biphenyl (polymer V2)

Preparation of poly(2,5-diphenyl-p-phenylenvinylene)co(2-(3'-(3,7-dimethyloctyloxy)phenyl)-p-phenylenevinylene)

The polymerization reaction was carried out by a method analogous to example P1 in WO99/24526. 5.40 g (16.5 mmol) of 2',5'-bis(chloromethyl)-p-terphenyl (example E4) and 6.72 g (16.5 mmol) of 2,5-bis(chlormethyl)-3'-(3,7-dimethyloctyloxy)biphenyl were reacted with a total of 165 ml of 1 M KOtBu in a total of 2 l of 1,4-dioxane. During the reaction, the polymer precipitated spontaneously from the reaction solution as a fine yellow solid. After cooling, the polymer was isolated by filtration. Drying gave 10.92 g (65%) of the polymer V2 as a yellow powder. The polymer was insoluble in all solvents, even when hot, so that no NMR spectrum could be recorded and neither GPC nor electroluminescence data could be obtained.

EXAMPLE V3

Copolymer of 50% of 3,3"-bis(methoxy)-2',5'-dichloromethyl-p-terphenyl (E5) and 50% of 2,5-bis(chloromethyl)-1-(3,7-dimethyloctyloxy)-4-methoxybenzene (polymer V3)

Preparation of poly(2,5-bis[3-methoxyphenyl]-p-phenylenevinylene)co((2-(3,7-dimethyloctyloxy)-5-methoxyphenyl)-p-phenylenevinylene)

The polymerization reaction was carried out by a method analogous to example P1 in WO99/24526 using 11.02 g (28.5 mmol) of 3,3"-bis(methoxy)-2',5'-bis(chloromethyl)-p-terphenyl (E5) and 10.29 g (28.5 mmol) of 2,5-dichloromethyl-1-(3,7-dimethyloctyloxy)-4-methoxybenzene (see WO99/24526, example Z1 c), which were reacted with a total of 284 ml of 1 M KOtBu in a total of 3.45 l of 1,4-dioxane. The polymer precipitated spontaneously from the reaction solution as a fine orange solid. After cooling, the polymer was isolated by filtration. Drying gave 12.33 g (72%) of the polymer V3 as an orange powder. The polymer was insoluble in all solvents, even when hot, so that no NMR spectrum could be recorded and neither GPC nor electroluminescence data could be obtained.

Part 3: Preparation and Characterization of LEDs:

LEDs were produced by the general process outlined below. Naturally, this had to be adapted to the particular circumstances (e.g. polymer viscosity and optimum layer thickness of the polymer in the device). The LEDs described below were in each case single-layer systems, i.e. substrate//ITO//polymer//cathode.

General process for the production of high-efficiency long-life LEDs:

After the ITO-coated substrates (e.g. glass support, PET film) have been cut to the correct size, they are cleaned in a number of cleaning steps in an ultrasonic bath (e.g. soap solution, Millipore water, isopropanol). For drying, they are blown with an N$_2$ gun and stored in a desiccator. Before coating with the polymer, they are treated in an ozone plasma unit for about 20 minutes. A solution of the respective polymer (in general with a concentration of 4–25 mg/ml in, for example, toluene, chlorobenzene, xylene:cyclohexanone (4:1)) is made up and the polymer is dissolved by stirring at room temperature. Depending on the polymer, it may also be advantageous to stir at 50–70° C. for some time. When the polymer has dissolved completely, the solution is filtered through a 5 µm filter and applied by means of a spin coater at variable speeds (400–6000). The thicknesses of the layers can be varied in this way in the range from about 50 to 300 nm.

Electrodes are then applied to the polymer films. This is generally carried out by thermal vapor deposition (Balzer BA360 or Pfeiffer PL S 500). The transparent ITO electrode is then connected as anode and the metal electrode (e.g. Ca) is connected as cathode, and the device parameters are determined.

Figure 3B:
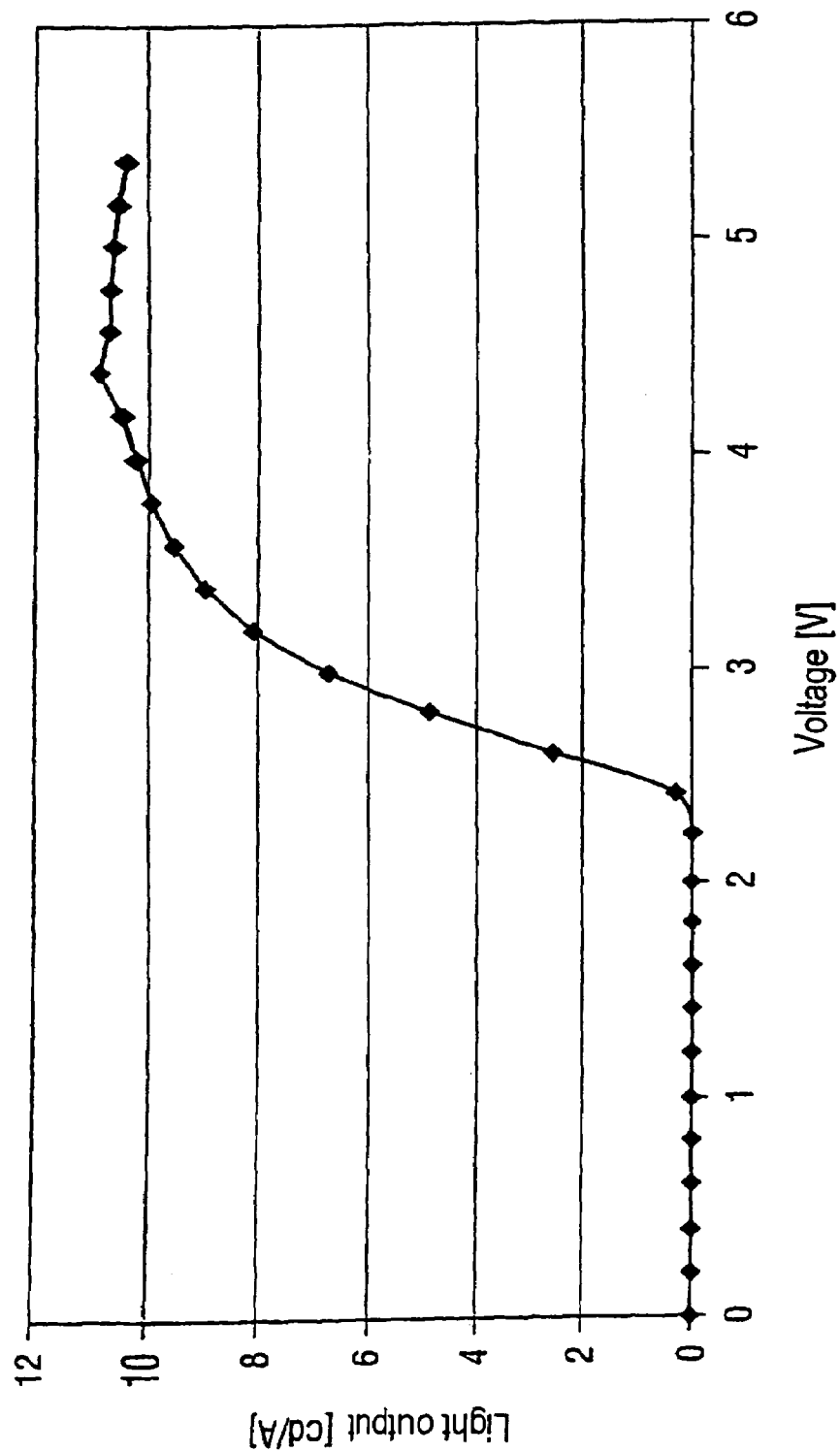

The results obtained using the polymers described are summarized in tables 1 and 2. In addition, the typical IVL characteristics in a test polymer LED are shown for polymer P1 in FIGS. 3a–3c.

TABLE 1

| Polymer from example [a] | Conc. of solution [mg/ml] | Spinning speed [rpm] | TBB content [%] | Luminous efficiency [Cd/A] | maxEL [nm] | Color | U for 100 cd/m$^2$ [V] | I/area for 100 cd/m$^2$ [mA/cm$^2$] |
|---|---|---|---|---|---|---|---|---|
| P1 | 5 [b] | 700 | 7.6 | 9.1 | 516 | green | 3.5 | 1.7 |
| P2 | 5 [c] | 500 | 3.9 | 10.4 | 514 | green | 3.2 | 1.5 |
| P3 | 5 [b] | 1000 | 6.7 | 8.2 | 517 | green | 3.7 | 1.9 |
| P4 | 5 [b] | 1400 | 4.0 | 11.1 | 514 | green | 3.7 | 1.7 |
| P5 | 5 [b] | 1000 | 5.0 | 13.4 | 516 | green | 3.5 | 1.5 |
| P6 | 5 [b] | 1300 | 4.2 | 8.5 | 514 | green | 3.6 | 1.9 |
| P7 | 5 [b] | 1500 | 4.9 | 8.5 | 515 | green | 3.7 | 1.8 |
| P8 | 5 [b] | 750 | 3.2 | 9.8 | 540 | yellowish-green | 3.3 | 1.5 |
| V1 | 8 [b] | 2200 | 12% | 7.8 | 519 | green | 3.7 | 2.2 |

[a] cathode material: Ca; device size: 4 × 4 mm$^2$; layer thickness: 80 nm
[b] solutions in toluene
[c] solutions in chlorobenzene

TABLE 2

| Polymer | M1 [%] | M2 [%] | M3 [%] | M4 [%] | TBB [%] | T½ [h][a] | dU/dt[a] [mV/h] |
|---|---|---|---|---|---|---|---|
| P1 | (structure, 30%) | (structure, 70%) | — | — | 7.6 | 150 | 10 |
| P2 | (structure, 50%) | (structure, 40%) | (structure, 10%) | — | 3.9 | 400 | 2–3 |
| P3 | (structure, 40%) | (structure, 60%) | — | — | 6.7 | 200 | 6–8 |

TABLE 2-continued
| Polymer | M1 [%] | M2 [%] | M3 [%] | M4 [%] | TBB [%] | T½ [h][a] | dU/dt[a] [mV/h] |
|---|---|---|---|---|---|---|---|
| P4 | 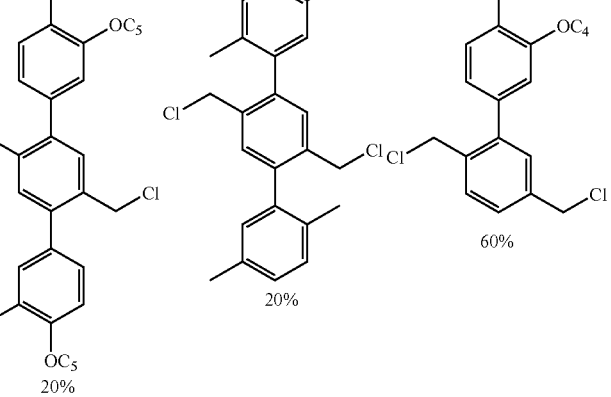 20% | 20% | 60% | — | 4.0 | 380 | 4 |
| P5 | 40% | 60% | — | — | 5.0 | 250 | 5–6 |
| P6 | 25% | 25% | 25% | 25% | 4.2 | 330 | 5 |

TABLE 2-continued

| Polymer | M1 [%] | M2 [%] | M3 [%] | M4 [%] | TBB [%] | T½ [h][a] | dU/dt[a] [mV/h] |
|---|---|---|---|---|---|---|---|
| P7 | 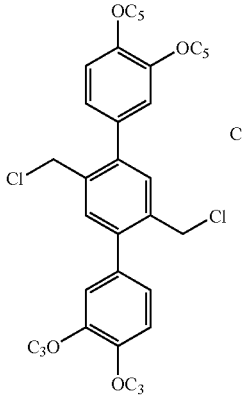 25% | 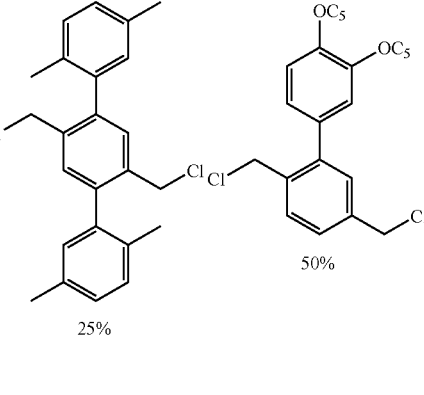 25% |  50% | — | 4.9 | 230 | 6 |
| P8[b] | 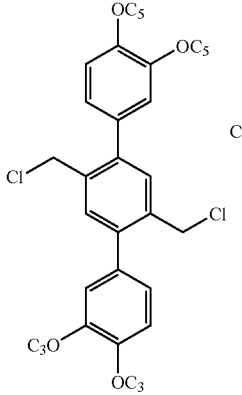 25% | 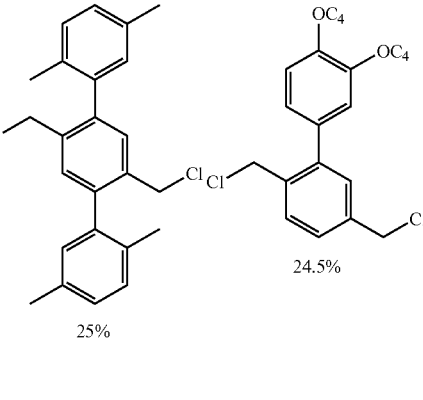 25% | 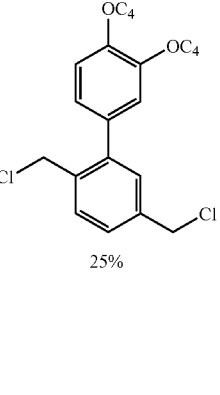 24.5% | 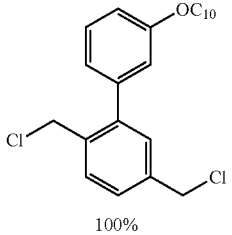 25% | 3.2 | 420 | 2–3 |
| V1 | (100%) | — | — | — | 12 | 3 | 2000 |

[a]measurement conditions: accelerated degradation at 200 Cd/m² and 70° C. (acceleration factor of about 40).
T½: decrease in the brightness by 50% of the initial brightness.
dU/dt: change in the electric potential with operating time (mean).
[b]plus 0.5 mol % of 2,5-bis(chloromethyl)-1-methoxy-4-(3,7-dimethyloctyloxy)benzene

[a]measurement conditions: accelerated degradation at 200 Cd/m² and 70° C. (acceleration factor of about 40).

T1/2: decrease in the brightness by 50% of the initial brightness.

dU/dt: change in the electric potential with operating time (mean).

[b] plus 0.5 mol % of 2,5-bis(chloromethyl)-1-methoxy-4-(3,7-dimethyloctyloxy)benzene It can easily be seen from a comparison of the examples P with the examples V that the solubility of the polymers is greatly influenced by the chosen composition. Polymers as described in the prior art are found to be unprocessable or insoluble in accordance with the definitions of the present text.

Table 1 and especially table 2 demonstrate that the polymers of the invention are outstandingly suitable for use in PLEDs and have significant advantages over known compounds, particularly in respect of operational stability at elevated temperatures.

What is claimed is:

1. A poly(arylenevinylene) polymer comprising at least 25 mol% of one or more repeating units of the formula (I),

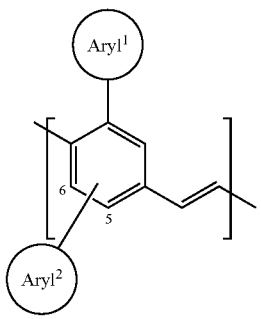

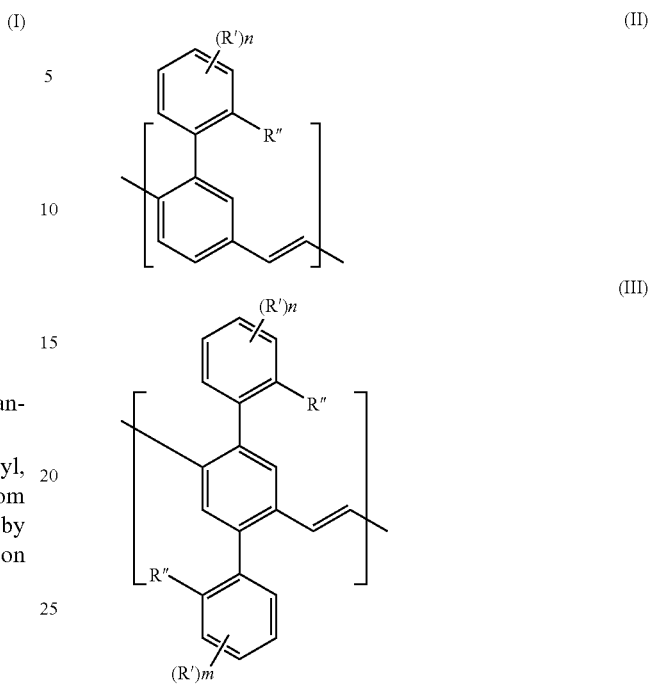

wherein the symbols and indices have the following meanings:

Aryl¹ and Aryl² are independently 2-(1,3,4-oxadiazol)yl, or aryl or heteroaryl aromatic groups which have from 4 to 14 carbon atoms, and are optionally substituted by from 1 to 5 substituents of R'; and Aryl² is in position no. 5 or 6 in the formula (I);

R' is, identical or different at each occurrence, and is a) CN, b) F, c) Cl, d) a straight-chain, branched or cyclic alkyl group having from 1 to 20 carbon atoms and wherein one or more nonadjacent $CH_2$ groups is optionally replaced by —O—, —S—, —CO—, —COO—, —O—CO—, —$NR^1$—, —$(NR^2R^3)^+$—$A^-$ or —$CONR^4$— and one or more H atoms is optionally replaced by F, e) a straight-chain, branched or cyclic alkoxy group having from 1 to 20 carbon atoms and wherein one or more nonadjacent $CH_2$ groups is optionally replaced by —O—, —S—, —CO—, —COO—, —O—CO—, —$NR^1$—, —$(NR^2R^3)^+$—$A^-$ or —$CONR^4$— and one or more H atoms is optionally replaced by F, f) an aryl group which has from 4 to 14 carbon atoms and is optionally substituted by one or more nonaromatic radicals R', or g) a heteroaryl group which has from 4 to 14 carbon atoms and is optionally substituted by one or more nonaromatic radicals R', and;

$R^1$, $R^2$, $R^3$ and $R^4$ are identical or different and are each H or an aliphatic or aromatic hydrocarbon radical having from 1 to 20 carbon atoms;

$A^-$ is a singly charged anion or its equivalent;

and the polymer is soluble; with the proviso that the two aryl groups Aryl¹ and Aryl² are substituted by R' substituents in such a way that the total number of nonaromatic carbon atoms present in the identical or different substituents R' is at least 4, and at the same time either the total proportion of repeating units (I) does not exceed 50 mol% or at least 5 mol% of a selected, bulky repeating unit of the type (II) or (III)

which increases the solubility are present, wherein

R' is defined above,

R'' are identical or different and are each a) a straight-chain, branched or cyclic $C_1$–$C_6$-alkyl group wherein one or more nonadjacent $CH_2$ groups is optionally replaced by —O—, —S—, —CO—, —COO—, —O—CO—, —$NR^1$—, —$(NR^2R^3)^+$—$A^-$ or —$CONR^4$— and one or more H atoms is optionally replaced by F;

b) a straight-chain, branched or cyclic $C_1$–$C_6$-alkoxy group, wherein one or more nonadjacent $CH_2$ groups is optionally replaced by —O—, —S—, —CO—, —COO—, —O—CO—, NR, —$(NR^2R^3)^+$—$A^-$ or —$CONR^4$— and one or more H atoms is optionally replaced by F;

c) an aryl group which has from 4 to 12 carbon atoms and is optionally substituted by one or more nonaromatic radicals R''; or d) a heteroaryl group which has from 4 to 12 carbon atoms and is optionally substituted by one or more nonaromatic radicals R'';

n and m are identical or different and are each 0, 1, 2, 3 or 4;

with the proviso that when the repeating unit of the formula (I) also contains 2,5-bis(4-substituted phenyl)phenylenevinylene structural units, their total does not exceed 20 mol%.

2. The poly(arylenevinylene) as claimed in claim 1, wherein R'' are identical or different and are each phenyl or $C_1$–$C_6$-alkyl.

3. The poly(arylenevinylene) as claimed in claim 2, wherein R'' are each methyl.

4. The poly(arylenevinylene) as claimed in claim 1, which comprises a copolymer comprising repeating units of the formula (I) and repeating units containing unsubstituted and/or substituted poly(arylenevinylene) structures.

5. The poly(arylenevinylene) as claimed in claim 4, wherein the copolymer is a random, alternating, regular and/or block-like copolymer.

6. The poly(arylenevinylene) as claimed in claim 4, which comprises a 2,5-dialkoxy-1,4-phenylenevinylene structure or a 2-aryl-1,4-arylenevinylene structure or mixture thereof.

7. The poly(arylenevinylene) as claimed in claim 1, wherein 1, 2 or 3 different repeating units of the formula (I) are present.

8. The poly(arylenevinylene) as claimed in claim 1, wherein $Aryl^1$ and $Aryl^2$ are identical or different and are each phenyl, 1-naphthyl, 2-naphthyl, 1-anthracenyl, 2-anthracenyl, 9-anthracenyl, 2-pyridinyl, 3-pyridinyl, 4-pyridinyl, 2-pyrimidinyl, 4-pyrimidinyl, 5-pyrimidinyl, 2-pyrazinyl, 3-pyridazinyl, 4-pyridazinyl, 2-quinoline, 3-quinoline, 4-quinoline, 5-quinoline, 6-quinoline, 7-quinoline, 8-quinoline, 2-thiophenyl, 3-thiophenyl, 2-pyrrolyl, 3-pyrrolyl, 2-furanyl, 3-furanyl or 2-(1,3,4-oxadiazol)yl and said $Aryl^1$ and $Aryl^2$ are optionally substituted by 1 to 5 substituents of R'.

9. The poly(arylenevinylene) as claimed in claim 8, wherein said $Aryl^1$ and $Aryl^2$ are identical or different and are each phenyl, 1-naphthyl, 2-naphthyl or 9-anthracenyl and said $Aryl^1$ and $Aryl^2$ are optionally substituted by 1 to 5 substituents of R'.

10. The poly(arylenevinylene) as claimed in claim 1, wherein the aryl substituents $Aryl^1$ and $Aryl^2$ have the substitution pattern 2-alkyl(oxy)phenyl, 3-alkyl(oxy)phenyl, 4-alkyl(oxy)phenyl, 2,3-dialkyl(oxy)phenyl, 2,4-dialkyl(oxy)phenyl, 2,5-dialkyl(oxy)phenyl, 2,6-dialkyl(oxy)phenyl, 3,4-dialkyl(oxy)phenyl, 3,5-dialkyl(oxy)phenyl, 2,3,4-trialkyl(oxy)phenyl, 2,3,5-trialkyl(oxy)phenyl, 2,3,6-trialkyl(oxy)phenyl, 2,4,5-trialkyl(oxy)phenyl, 2,4,6-trialkyl(oxy)phenyl, 3,4,5-trialkyl(oxy)phenyl, 2-alkyl(oxy)-1-naphthyl, 3-alkyl(oxy)-1-naphthyl, 4-alkyl(oxy)-1-naphthyl, 5-alkyl(oxy)-1-naphthyl, 6-alkyl(oxy)-1-naphthyl, 7-alkyl(oxy)-1-naphthyl, 8-alkyl(oxy)-1-naphthyl, 1-alkyl(oxy)-2-naphthyl, 3-alkyl(oxy)-2-naphthyl, 4-alkyl(oxy)-2-naphthyl, 5-alkyl(oxy)-2-naphthyl, 6-alkyl(oxy)-2-naphthyl, 7-alkyl(oxy)-2-naphthyl, 8-alkyl(oxy)-2-naphthyl or 10-alkyl(oxy)-9-anthracenyl.

11. The poly(arylenevinylene) as claimed in claim 1, wherein repeating units of the formula (I) are present in an amount of at least 30 mol %.

12. The poly(arylenevinylene) as claimed in claim 1, wherein the two aryl groups $Aryl^1$ and $Aryl^2$ in formula (I) are different from one another.

13. The poly(arylenevinylene) as claimed in claim 1, wherein the polymer is made up of from 10 to 10,000 repeating units.

14. The poly(arylenevinylene) as claimed in claim 1, wherein the polymer is made up of from 20 to 5,000 repeating units.

15. The poly(arylenevinylene) as claimed in claim 1, wherein the polymer is made up of from 100 to 5,000 repeating units.

16. The poly(arylenevinylene) as claimed in claim 1, wherein the polymer is made up of from 250 to 2,000 repeating units.

17. An electroluminescent device comprising a cathode, an anode and one or more active layers, where at least one of said active layers comprises one or more of the poly (arylenevinylenes) as claimed in claim 1.

* * * * *